US009792995B1

(12) United States Patent
Shah et al.

(10) Patent No.: US 9,792,995 B1
(45) Date of Patent: Oct. 17, 2017

(54) INDEPENDENT MULTI-PLANE READ AND LOW LATENCY HYBRID READ

(71) Applicant: SanDisk Technologies Inc., Plano, TX (US)

(72) Inventors: Grishma Shah, Milpitas, CA (US); Yan Li, Milpitas, CA (US); Jian Chen, San Jose, CA (US); Kenneth Louie, Sunnyvale, CA (US); Nian Niles Yang, Mountain View, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/138,467

(22) Filed: Apr. 26, 2016

(51) Int. Cl.
| | |
|---|---|
| *G11C 16/26* | (2006.01) |
| *G11C 16/04* | (2006.01) |
| *G06F 12/0802* | (2016.01) |
| *G11C 11/56* | (2006.01) |
| *H01L 27/11556* | (2017.01) |
| *H01L 27/11582* | (2017.01) |

(52) U.S. Cl.
CPC .......... *G11C 16/26* (2013.01); *G06F 12/0802* (2013.01); *G11C 11/56* (2013.01); *G11C 11/5642* (2013.01); *G11C 16/0483* (2013.01); *H01L 27/11556* (2013.01); *H01L 27/11582* (2013.01); *G06F 2212/60* (2013.01)

(58) Field of Classification Search
CPC ................ G11C 11/56; G11C 11/5642; G11C 16/0483; G11C 16/08; G11C 16/26; H01L 27/11582; H01L 27/11556
See application file for complete search history.

(56) References Cited

U.S. PATENT DOCUMENTS

| | | | |
|---|---|---|---|
| 7,120,051 B2 | 10/2006 | Gorobets et al. | |
| 7,467,253 B2 | 12/2008 | Yero | |
| 8,072,805 B2 | 12/2011 | Chou et al. | |
| 8,347,042 B2 | 1/2013 | You | |
| 8,521,945 B2 | 8/2013 | Tan et al. | |
| 8,687,420 B2 | 4/2014 | Shibata et al. | |

(Continued)

FOREIGN PATENT DOCUMENTS

WO WO2012/087411 A1 6/2012

OTHER PUBLICATIONS

Micheloni, R., et al., "2 NAND overview: from memory to systems," Inside NAND Flash Memories, Jan. 2010, 36 pages.

(Continued)

*Primary Examiner* — Vanthu Nguyen
(74) *Attorney, Agent, or Firm* — Vierra Magen Marcus LLP

(57) ABSTRACT

Read operations are performed in a multi-plane memory device. A state machine interfaces an external controller to each plane of memory cells to allow reading from selected word lines in the planes. In one approach, different types of read operations are performed in different planes, such as a multi-level cell read, e.g., a lower, middle or upper page read and a single-level cell (SLC) read. When the read operation in one plane uses fewer read voltages than another plane, the read data can be output early from the one plane while read operations continue on the other plane. The external controller can also command a cache release for one plane after outputting data from the caches of another plane. Read voltages can be set for each plane in a respective set of registers.

6 Claims, 29 Drawing Sheets

(56) References Cited

U.S. PATENT DOCUMENTS

| | | |
|---|---|---|
| 8,825,941 B2 | 9/2014 | Moshayedi et al. |
| 9,053,810 B2 | 6/2015 | Dutta et al. |
| 9,081,664 B2 | 7/2015 | Tanimoto et al. |
| 9,176,862 B2 | 11/2015 | Chen et al. |
| 2005/0207231 A1 | 9/2005 | Kim |
| 2010/0058003 A1 | 3/2010 | Goto et al. |
| 2010/0329018 A1 | 12/2010 | Joo |
| 2011/0153912 A1 | 6/2011 | Gorobets et al. |
| 2012/0167100 A1* | 6/2012 | Li .................... G11C 16/26 718/102 |
| 2013/0141971 A1* | 6/2013 | Hosono ............ G11C 11/5628 365/185.02 |
| 2014/0226402 A1 | 8/2014 | Duzly et al. |
| 2015/0380097 A1* | 12/2015 | Sato .................... G11C 8/08 365/185.03 |
| 2016/0011779 A1* | 1/2016 | Lee .................... G06F 3/061 711/103 |

OTHER PUBLICATIONS

International Search Report & The Written Opinion of the International Searching Authority dated Apr. 19, 2017, International Application No. PCT/US2017/018547.

* cited by examiner

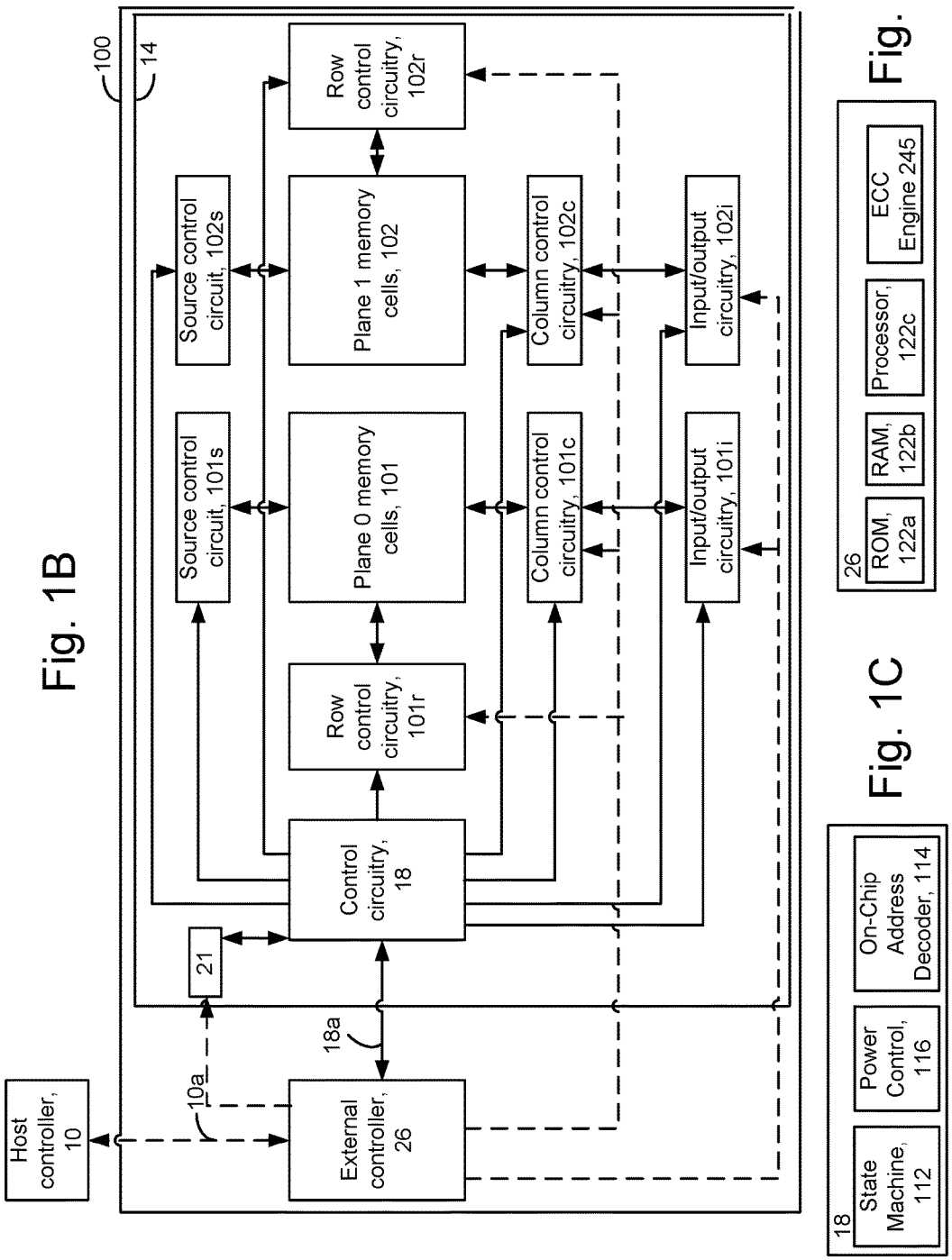

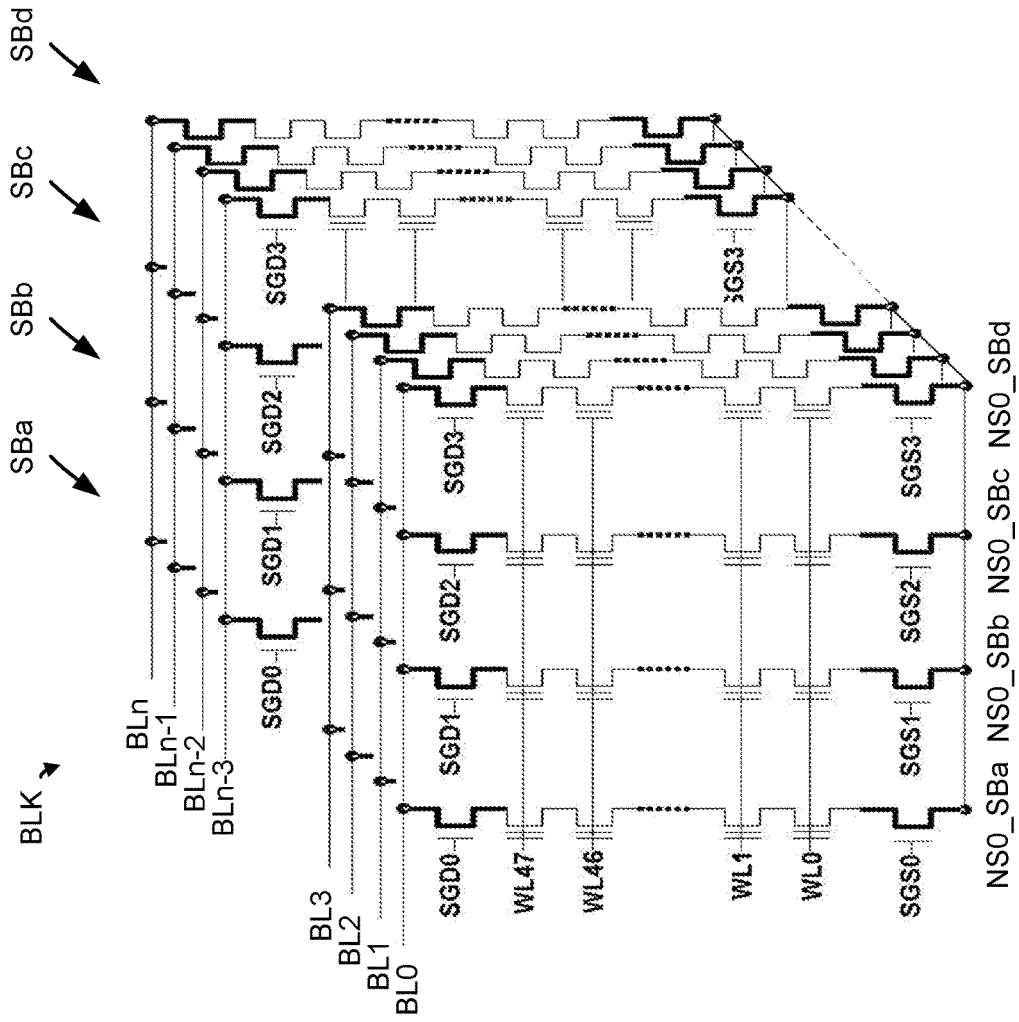

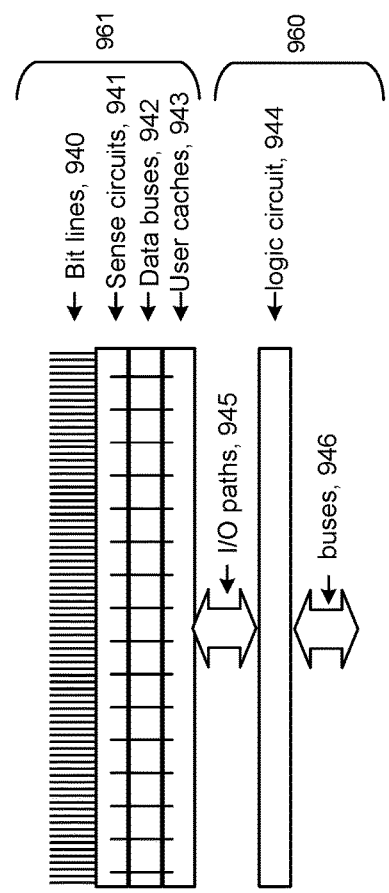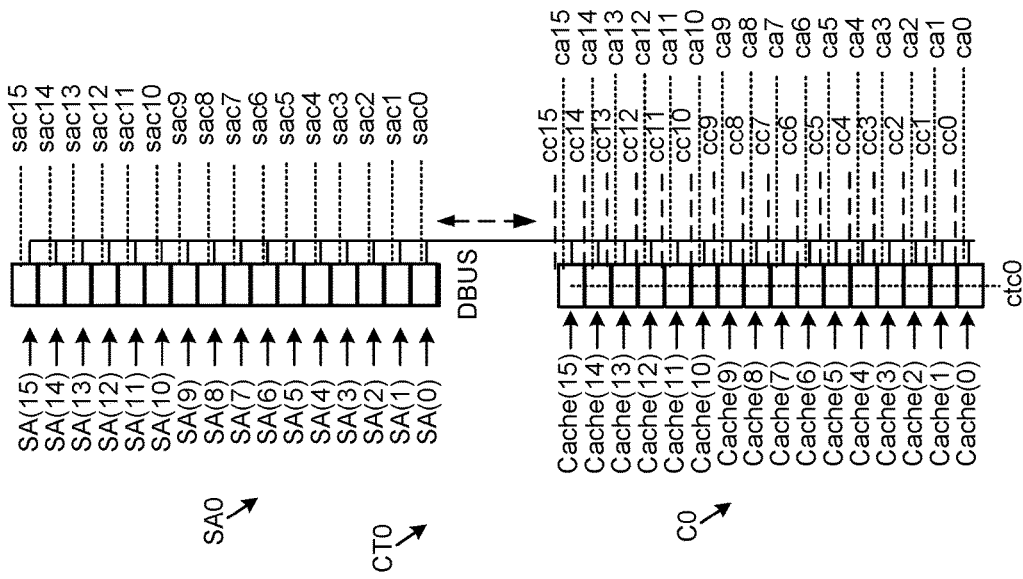

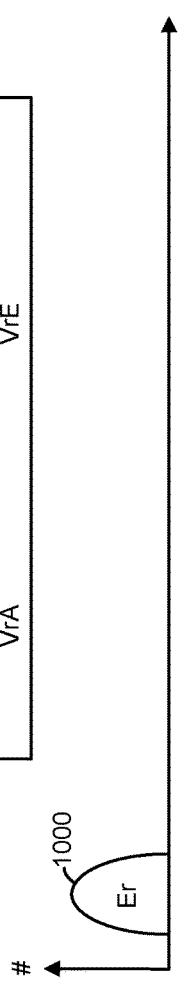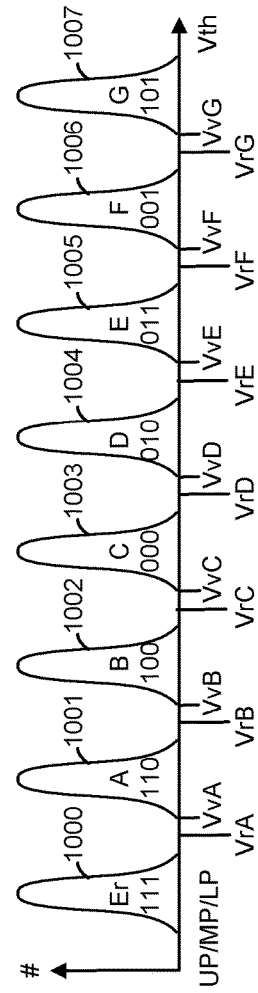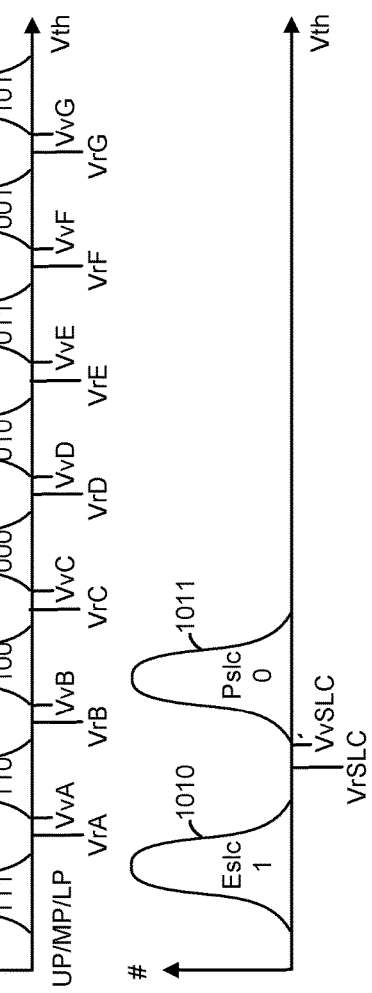

| LP | Er | A | B | C | D | E | F | G |
|----|----|----|----|----|----|----|----|----|
| 1  |    | 0  | 0  | 0  | 0  | 0  | 0  | 0  |

↑VrA

Fig. 10G

| LP | Er | A | B | C | D | E | F | G |
|----|----|----|----|----|----|----|----|----|
| 0  |    | 0  | 0  | 0  | 0  | 1  | 1  | 1  |

↑VrE

Fig. 10H

| LP | Er | A | B | C | D | E | F | G |
|----|----|----|----|----|----|----|----|----|
| 1  |    | 0  | 0  | 0  | 0  | 1  | 1  | 1  |

Fig. 10I

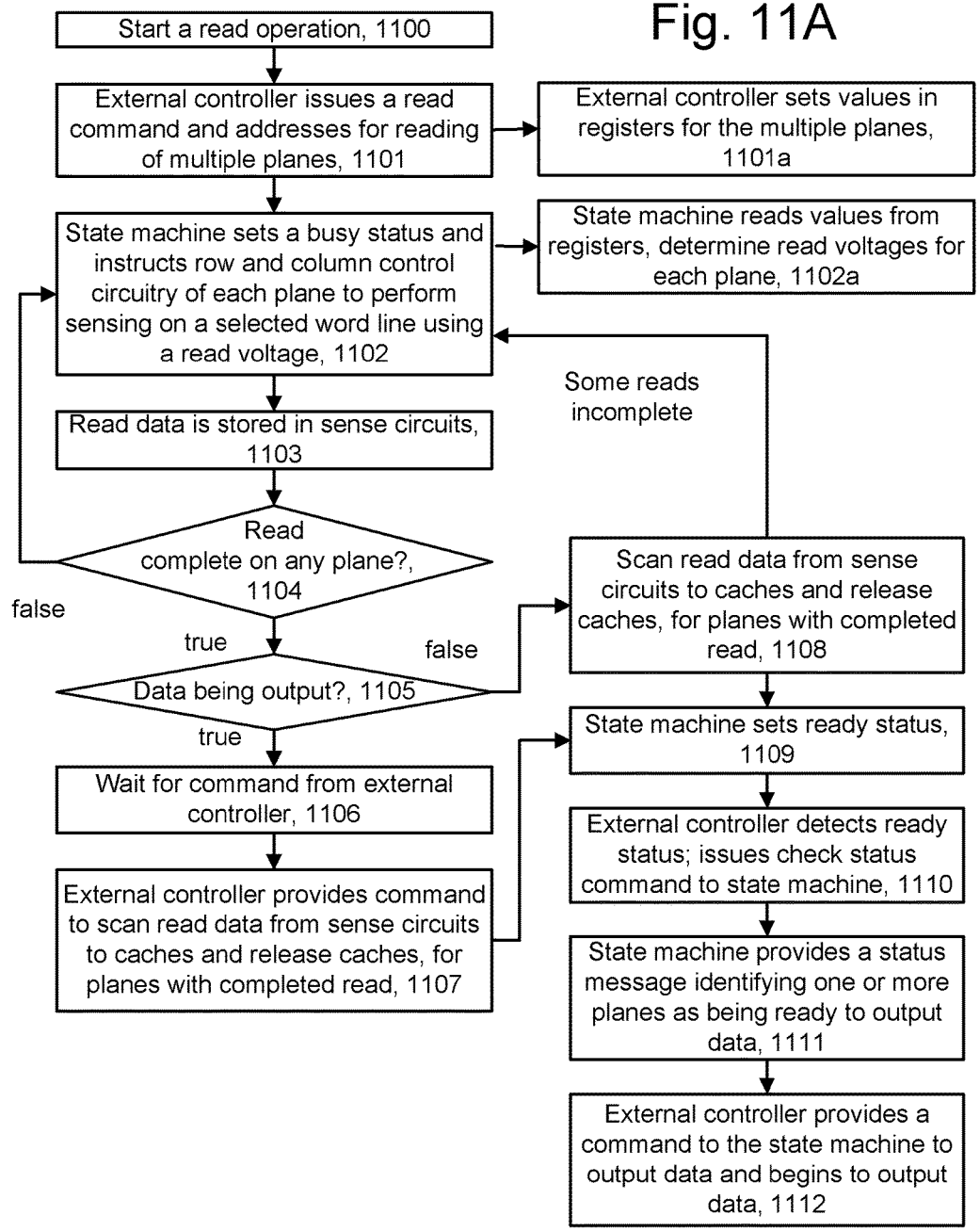

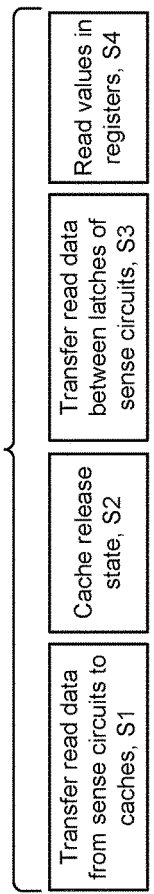
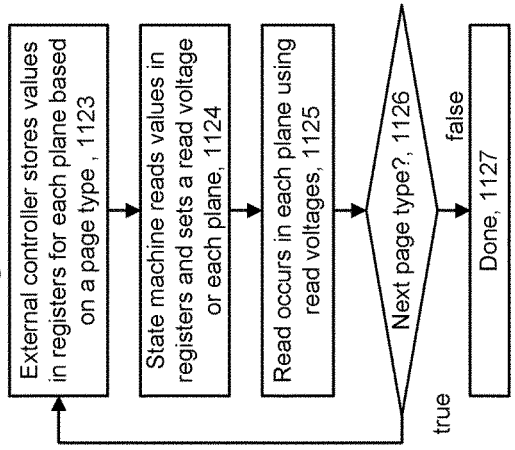

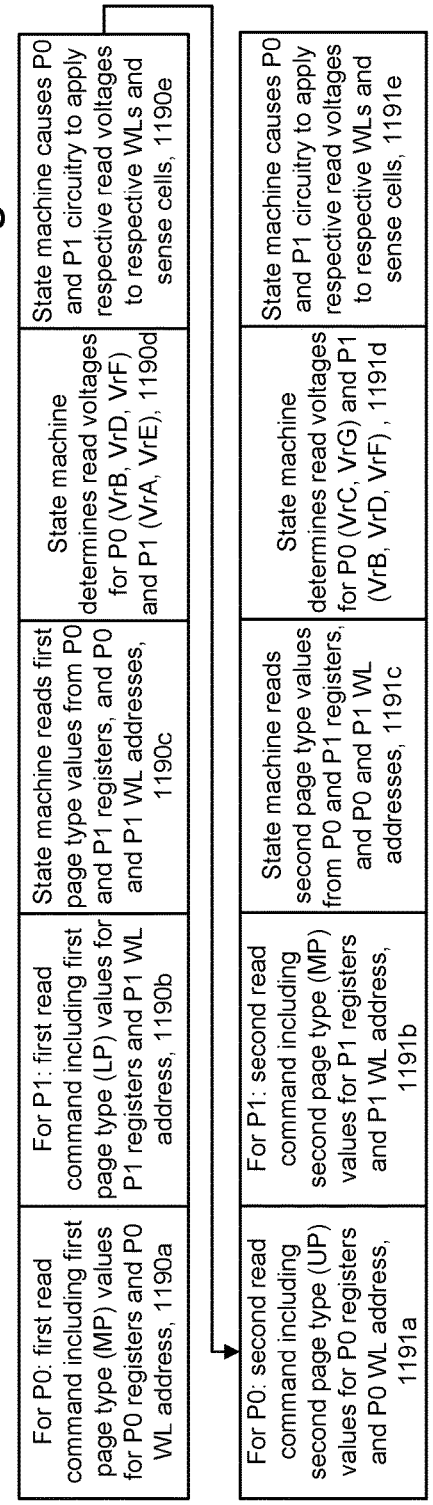

| Byte# | P0 Value |
|---|---|
| B0 | 1st read value |
| B1 | 2nd read value |
| B2 | -- |
| B3 | -- |

1140 addr1

| Byte# | P0 LP Value |
|---|---|
| B0 | VrB |
| B1 | -- |
| B2 | -- |
| B3 | -- |

1140a

| Byte# | P0 UP Value |
|---|---|
| B0 | VrA |
| B1 | VrC |
| B2 | -- |
| B3 | -- |

1140b

| Byte# | P1 Value |
|---|---|
| B0 | 1st read value |
| B1 | 2nd read value |
| B2 | -- |
| B3 | -- |

1141 addr2

| Byte# | P1 LP Value |
|---|---|
| B0 | VrB |
| B1 | -- |
| B2 | -- |
| B3 | -- |

1141a

| Byte# | P1 UP Value |
|---|---|
| B0 | VrA |
| B1 | VrC |
| B2 | -- |
| B3 | -- |

1141b

| Byte# | P0 Value |
|---|---|
| B0 | Vrslc |

| Byte# | P1 Value |
|---|---|
| B1 | Vrslc |

1142 addr3

Fig. 11E

| Byte# | P0 Value | | LP Value | LMP Value | UMP Value | UP Value |
|---|---|---|---|---|---|---|
| B0 | 1st read value | | VrS1 state | VrS2 state | VrS4 state | VrS8 state |
| B1 | 2nd read value | | VrS3 state | VrS6 state | VrS11 state | -- |
| B2 | 3rd read value | | VrS5 state | VrS10 state | VrS15 state | -- |
| B3 | 4th read value | | VrS7 state | VrS12 state | -- | -- |
| B4 | 5th read value | | VrS9 state | VrS14 state | -- | -- |
| B5 | 6th read value | | VrS13 state | -- | -- | -- |
| B6 | -- | | -- | -- | -- | -- |
| B7 | -- | | | | | |
| | 1150 | | 1150a | 1150b | 1150c | 1150d | addr1

| Byte# | P1 Value | | LP Value | LMP Value | UMP Value | UP Value |
|---|---|---|---|---|---|---|
| B0 | 1st read value | | VrS1 state | VrS2 state | VrS4 state | VrS8 state |
| B1 | 2nd read value | | VrS3 state | VrS6 state | VrS11 state | -- |
| B2 | 3rd read value | | VrS5 state | VrS10 state | VrS15 state | -- |
| B3 | 4th read value | | VrS7 state | VrS12 state | -- | -- |
| B4 | 5th read value | | VrS9 state | VrS14 state | -- | -- |
| B5 | 6th read value | | VrS13 state | -- | -- | -- |
| B6 | -- | | -- | -- | -- | -- |
| B7 | -- | | | | | |
| | 1151 | | 1151a | 1151b | 1151c | 1151d | addr2

| Byte# | P0 Value |
|---|---|
| B0 | Vrslc |

| Byte# | P1 Value |
|---|---|
| B1 | Vrslc |

1152 addr3

Fig. 11F

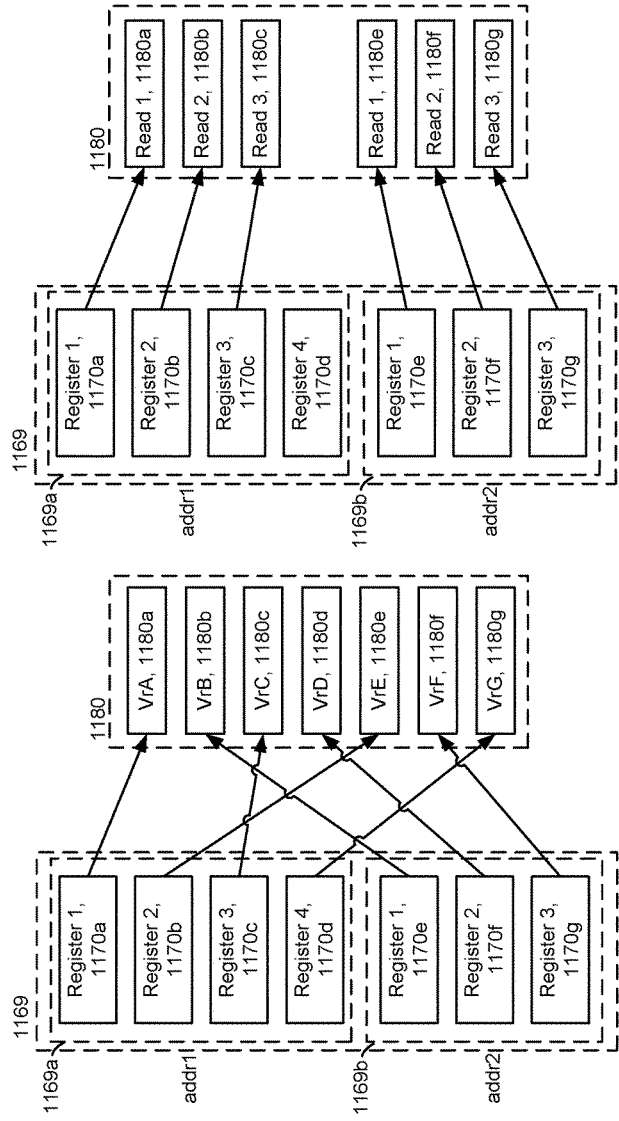

INDEPENDENT MULTI-PLANE READ AND LOW LATENCY HYBRID READ

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 1B is a block diagram of an example of the storage system of FIG. 1A.

FIG. 1C is a block diagram of an example of the control circuitry of FIG. 1B.

FIG. 1D is a block diagram of an example of the external controller of FIG. 1B.

FIG. 7 depicts an example view of NAND strings in sub-blocks in a 3D configuration which is consistent with FIG. 5.

FIG. 9B depicts an example sensing circuit and input/output circuitry consistent with FIG. 9A.

FIG. 9C depicts an example transfer of data between the sense amplifiers and the caches of the cache tier CT0 of FIG. 9A in a read operation such as discussed in connection with FIG.

FIG. 10A depicts bit sequences for different data states and for lower, middle and upper pages of data, and associated read voltages.

FIG. 10B depicts an initial threshold voltage distribution in which all memory cells are in the erased state.

FIG. 10C depicts a final threshold voltage distribution in which some memory cells remain in the erased state while other memory cells are programmed to one of seven different programmed data states, consistent with FIG. 10A.

FIG. 10D depicts a Vth distribution 1010 of memory cells in an erased state and a Vth distribution 1011 comprising memory cells in a programmed data state, in an example of single-level cell (SLC) programming.

FIG. 10G depicts example bit values assigned after a read operation of a lower page using VrA, consistent with FIG. 10A.

FIG. 10H depicts example bit values assigned after a read operation of a lower page using VrE, consistent with FIG. 10A.

FIG. 10I depicts example bit values obtained by combining the bit values from the read operations of FIGS. 10G and 10H.

FIG. 11A depicts an example read process in a multi-plane memory device.

FIG. 11B depicts example states of a state machine in the read process of FIG. 11A.

FIG. 11C1 depicts an example of registers which store values which indicate read voltages, where the registers are mapped to data states and the same registers are shared by different planes, for an eight state memory device, consistent with FIG. 11G.

FIG. 11C2 depicts a flowchart of a process in which data is stored in registers and read by a state machine, consistent with steps 1101a and 1102a of FIG. 11A.

FIG. 11D1 depicts another example of registers which store values which indicate read voltages, where the registers are mapped to a series of voltages in a particular page type of a read operation, and separate sets of registers are provided for different planes, for an eight state memory device, consistent with FIG. 11H.

FIG. 11D2 depicts an example sequence of commands and events in a read operation, consistent with FIGS. 11D1 and 12A.

FIG. 11E depicts another example of registers which store values which indicate read voltages, where the registers are mapped to a series of voltages in a particular page type of a read operation, and separate sets of registers are provided for different planes, for a four state memory device, consistent with FIG. 11H.

FIG. 11F depicts another example of registers which store values which indicate read voltages, where the registers are mapped to a series of voltages in a particular page type of a read operation, and separate sets of registers are provided for different planes, for a sixteen state memory device, consistent with FIG. 11H.

FIG. 11G depicts a mapping between registers and data states, consistent with FIG. 11C1.

FIG. 11H depicts a mapping between registers and read operations, consistent with FIG. 11D1.

DETAILED DESCRIPTION

Figure 1A:
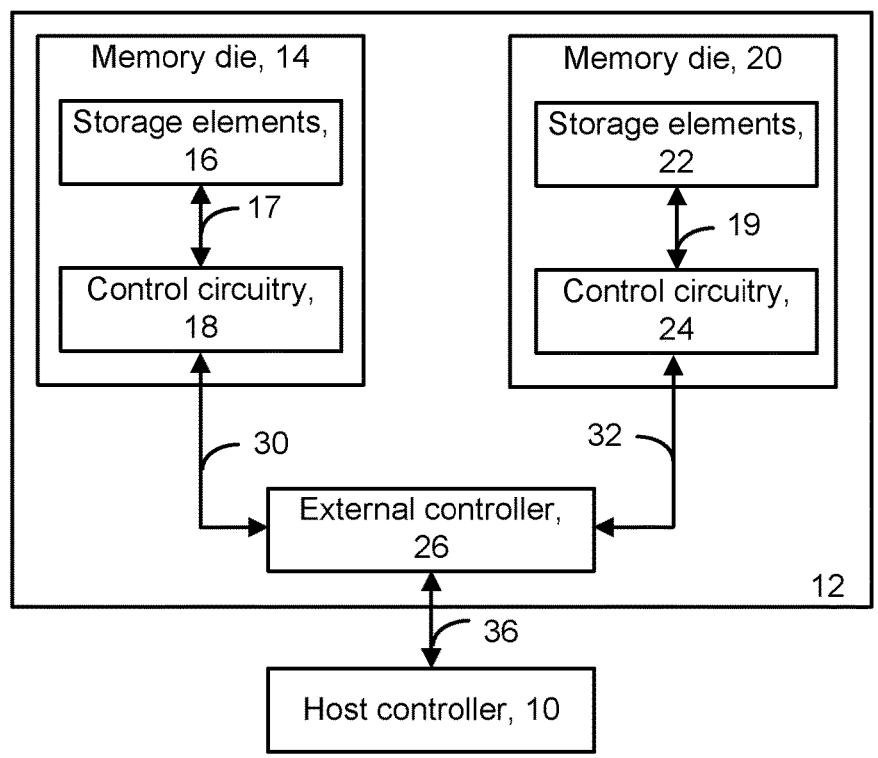
FIG. 1A is a block diagram of an example storage system in which an external controller communicates with control circuitry on one or more memory die.

Read operations are provided for a memory device which allow for efficient multi-plane reading. In one aspect, reading and early output of single bit memory cells occurs in one plane while reading and later output of multi-bit memory cells occurs in another plane. In another aspect, reading of same or different pages types occurs concurrently in different planes with read voltages customized for each plane. The selected word lines which are read can in the same or different relative locations within a block in the different planes. A high degree of flexibility and efficiency is thus achieved in concurrent multi-plane read operations. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed or target data state) different from the erased state. For example, in a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states. In a four-bit per cell memory device, there are sixteen data states including the erased state and fifteen programmed data states referred to as the S0, S1, S2, S3, S4, S5, S6, S7, S8, S9, S10, S11, S12, S13, S14 and S15 data states. Moreover, the write data may be represented by pages of data, where each bit of a cell is in a different page.

The data which is stored in a memory cell can be read in a read operation. In a read operation, one or more control gate voltages are applied to a set of memory cells connected to a selected word line while sense circuits determines whether the cells are in a conductive or non-conductive state. The threshold voltage of a cell can therefore be determined and associated with a particular data state.

In some cases, the memory cells can be stored in different planes, where a plane comprises a number of blocks of memory cells, and a block is a smallest unit of cells which can be concurrently erased. However, various difficulties can be encountered when reading multiple planes concurrently. For example, there may be restrictions on the ability to randomly select a word line to read in each plane. Further, there may be delays in outputting data when the read operations are completed at different times in different planes. There may be limitations in the ability to customize the read voltages in each plane.

Techniques provided herein address the above and other issues. In one aspect, a common control circuit, e.g., state machine, is configured to manage concurrent read operations in different planes. In another aspect, reading and early output of memory cells, such as single-bit memory cells, occurs in one plane while reading and later output of memory cells, such as multi-bit memory cells, occurs in another plane. In another aspect, the read voltages in each plane can be customized. A corresponding memory device is also provided.

Various other features and benefits are described below.

FIG. 1A is a block diagram of an example storage system in which an external controller communicates with control circuitry on one or more memory die 14 and 20. A host controller 10 communicates with an external controller 26 via one or more communication paths 36 such as one or more buses. The external controller, which can be a microcontroller, in turn can communicate with one or more memory die. The external controller is external to the memory die. Furthermore, multiple communication paths such as buses can be provided between the external controller and control circuitry which is on each die. For example, communication paths 30 and 32 are provided between the external controller 26 and the control circuitry 18 and 24, respectively. At least one communication path can also be provided between the external controller and control circuitry. The control circuitry 18 acts as an interface between the memory cells 16 and the external controller, while the control circuitry 24 acts as an interface between the memory cells 22 and the external controller. The external controller may also communicate with a register 21 to set values which indicate read voltages. The control circuitry 18 can communicate with the registers to read the values to determine read voltages to apply to a selected word line in each plane.

The communication path 36 can have an external ready or busy status which is set by the control circuitry. In one possible option, the external controller can access a ready/busy pin of the control circuitry via an auxiliary channel to determine the ready/busy status. In another possible option, the external controller accesses the ready/busy status via the same communication path over which it communicates commands and data. When the control circuitry is ready, the external controller knows that it is able to send commands and data to the control circuitry, and that the control circuitry is waiting to receive such commands, address and data. When the control circuitry is busy, the external controller waits to send most commands and data to the control circuitry. Commands for suspending and resuming tasks can be provided from the external controller to the control circuitry when the status is ready or busy, but may not be acted on by the control circuitry immediately when the status is busy. Check status commands can also be provided from the external controller to the control circuitry when the status is ready or busy.

The external controller can thus communicate with the control circuitry at any time, even when the busy status is set for the communication path. In one approach, the external controller 26 provides a manual suspend or resume command to the control circuitry and provides other commands and data to, and receives data from, the control circuitry. Each unit of control circuitry 18, 24 can communicate with its memory cells via a respective communication path 17, 19 internal to the memory chip. This internal communication path can have an internal ready or busy status. A suspend status can indicate whether a task is currently suspended by the control circuitry.

The commands provided to the control circuitry can include a manual suspend command a manual resume command, a program command, a read command, an erase command, and a check status command. The data provided to the control circuitry by the external controller can include program data which is to be written to memory cells. The data received by the external controller from the control circuitry can include read data which was read from memory cells, and status data which includes a task status and a suspend status. The status data can be returned in response to a check status command from the external controller. The status data can be a byte of data, for instance, in which the bit positions and values have pre-assigned meanings. In one approach, the byte identifies one or more planes which are ready to output data.

The task status can indicate whether a task has been successfully completed by the control circuitry, e.g., using a pass/fail indication, as well as providing a progress of the task. The progress of a program task, for instance, could indicate whether memory cells which are to be programmed to a certain target data state (e.g., A-state, B-state, . . . ) have completed programming. The task status can be for a previous task or a current task. The task status can indicate a type of the task, including multilevel cell (MLC), i.e., multi-bit cell, erasing or programming, or single level cell (SLC), i.e., single-bit cell, erasing or programming. An MLC read task uses two or more control gate/word line voltages to distinguish between three or more data states, while an SLC read task uses one control gate/word line voltage to distinguish between only two data states. An MLC program task uses two or more verify voltages to program a set of memory cells to two or more data states, while an SLC program task uses one verify voltage to program a set of memory cells to only one data state. A read operation can be made up of one or more read tasks, and a program operation can be made up of one or more program tasks. Each task of a read operation can involve reading a page of data. A program task can involve a transfer or write data from the external controller to caches of the memory die, and a read task can involve a transfer of read data from the caches to the external controller.

Example details of the storage system 12 are discussed next.

FIG. 1B is a block diagram of an example of the storage system of FIG. 1A. The memory device 100 may include one or more memory die 14. The memory cells 16 of memory die 14 can include multiple planes of memory cells such as plane 0 (101) and plane 1 (102). A plane may comprise a number of blocks of memory cells and associated row and column control circuitry. The memory cells in each plane may be arranged in a 2D or 3D memory structure, for example. An example memory structure comprises one or more arrays of memory cells.

Row control circuitry 101r, column control circuitry 101c and a source control circuit 101s are associated with the plane 101. Row control circuitry 102r, column control circuitry 102c and a source control circuit 102s are associated with the plane 102. The control circuitry 18 (see FIG. 1C), external controller 26 (see FIG. 1D) and host controller 10 are also depicted.

Each plane comprises a set of bit lines which is common to multiple blocks of the plane. The row control circuitry has the ability to concurrently supply a voltage on each word line of a selected block in the plane. For example, a program or read voltage can be provided on a selected word line while a pass voltage is provided on unselected word lines. The column control circuitry has the ability to concurrently supply a voltage on each bit line. Also, the column control circuitry includes sense blocks, e.g., sense circuitry for sensing, via the bit lines, the conductive state of memory cells connected to a selected word line in a selected block. The column control circuitry 101c and 102c, which may include latches and caches as discussed further below, communicates with input/output circuitry 101i and 102i, respectively, which may include input/output paths, logic circuits and buses (see FIG. 9B). The input/output circuitry in turn communicates with the external controller.

Commands and data are transferred between the host controller 10 and the external controller 26 via a data bus 10a, and between the external controller and the control circuitry via a path 18a. Other paths (represented by dashed lines) allow the external controller to communicate with the row control circuitry, column control circuitry and input/output circuitry. Other paths (represented by solid lines) allow the control circuitry to communicate with the source control circuits, row control circuitry, column control circuitry and input/output circuitry.

Generally, in a program operation, write data is transferred from the host controller to the external controller, then to the input/output circuitry, and then to the column control circuitry for programming into a selected word line. In a read operation, read data is read from a selected word line, stored in the column control circuitry, and then transferred to the input/output circuitry, the external controller and finally the host controller. In some cases, a program or read is performed by the external controller without a program or read command from the host controller, such as to transfer data between blocks or word lines.

The memory structure in each plane can be 2D or 3D. The memory structure may comprise one or more arrays of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

In some implementations, some of the components can be combined. In various designs, one or more of the components (alone or in combination), other than planes, can be thought of as at least one control circuit which is configured to perform the techniques described herein including the steps of the flowcharts provided herein. For example, a control circuit may include any one of, or a combination of, the host controller 10, the external controller 26, the control circuitry 18, the row and column control circuitry, the source control circuits, and the input/output circuits.

FIG. 1C is a block diagram of an example of the control circuitry of FIG. 1B. The control circuitry 18 includes a state machine 112, a power control module 116 and an on-chip address decoder 114. The state machine 112 provides chip-level control of memory operations. The state machine, also referred to as a finite state machine, is an abstract machine that can be in one of a finite number of states. In one approach, the machine is in only one state at a time, and can transition from one state to another when initiated by a triggering event or condition. A particular state machine can be defined by a list of its states, and the triggering condition for each transition. A state machine may be implemented, e.g., using a programmable logic device, a programmable logic controller, logic gates and flip flops or relays. A hardware implementation may use a register to store state variables, a block of combinational logic that determines the state transition, and a second block of combinational logic that determines the output of the state machine. A state machine can carry out lower-level processes relative to the external controller in a space-efficient manner.

The state machine is configured to interface the external controller to multiple planes, e.g., the first plane and the second plane, to set a busy status when the first and second circuitry of the first and second planes, respectively, are not ready to output data to the external controller, and to subsequently set a ready status when the first or second circuitry is ready to output data to the external controller. The state machine can also include a logic block which is used to read values from the registers 21 and derive read voltages from the values.

In one approach, as described herein, a state machine which is in one state at a time is used to manage concurrent read operations in multiple planes. The row and control circuitry of each plane perform an operation which is set by the current state.

The power control module 116 controls the power and voltages supplied to the word lines and bit lines during memory operations. It can include drivers for word lines, SGS and SGD transistors, source lines and bit lines. The sense blocks can include bit line drivers, in one approach. An SGS transistor is a select gate transistor at a source end of a NAND string, and an SGD transistor is a select gate transistor at a drain end of a NAND string. The on-chip address decoder 114 provides an address interface between addresses used by the host controller or the external controller to the hardware addresses used by the row and column control circuitry.

FIG. 1D is a block diagram of an example of the external controller of FIG. 1B. The external controller 26 may comprise a processor 122c, storage devices (memory) such as ROM 122a and RAM 122b and an error-correction code (ECC) engine 245. The ECC engine can correct up to a specified number of read errors.

The storage device comprises code such as a set of instructions, and the processor is operable to execute the set of instructions to provide the functionality described herein. Alternatively or additionally, the processor can access code from the memory structure, such as a reserved area of memory cells in one or more word lines.

For example, code can be used by the controller to access the planes such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage area for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

In one embodiment, the host controller is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host controller may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2A:
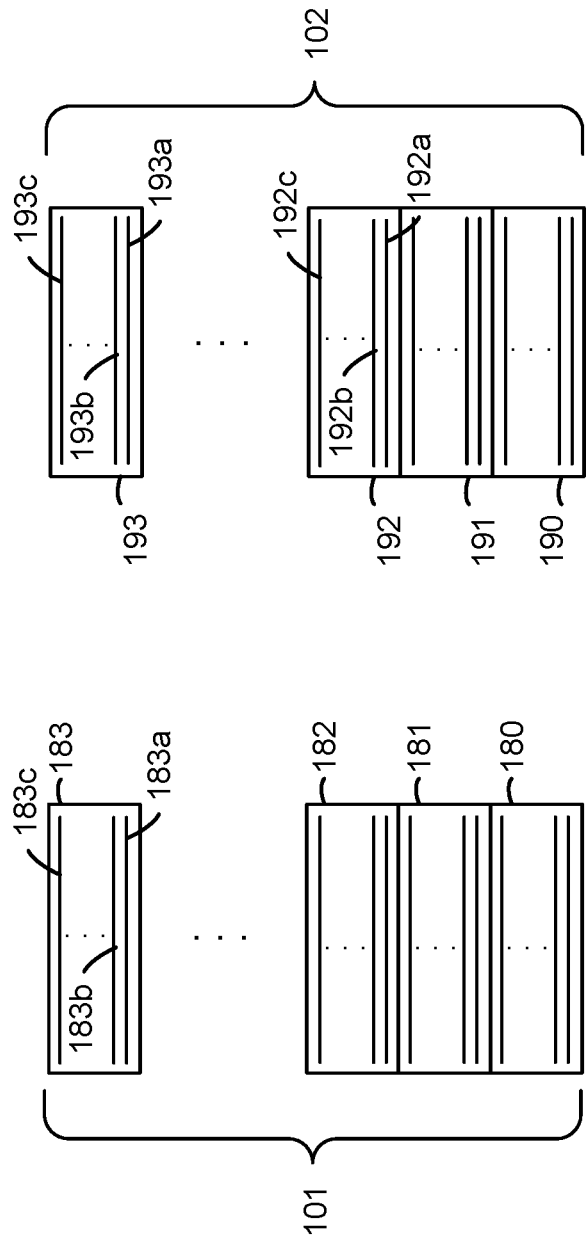
FIG. 2A depicts an example configuration of the planes of memory cells of FIG. 1B.

FIG. 2A depicts an example configuration of the planes of memory cells of FIG. 1B. The planes 101 and 102 from FIG. 1B are depicted. The plane 101 includes blocks 180, 181, 182 and 183, and the plane 102 includes blocks 190, 191, 192 and 193. Each block includes a number of word lines. For example, the block 183 includes word lines 183a, 183b, . . . , 183c. The block 192 includes word lines 192a, 192b, . . . , 192c. The block 193 includes word lines 193a, 193b, . . . , 193c. Each word line has a relative position within a block. For example, word lines 183a, 192a and 193a have a same relative position in blocks 183, 192 and 193, respectively. The relative position is the first word line in the block. Word lines 183a and 193b have a different relative position in blocks 183 and 193, respectively, i.e., the first and second word lines in a block, respectively.

Figure 2B:
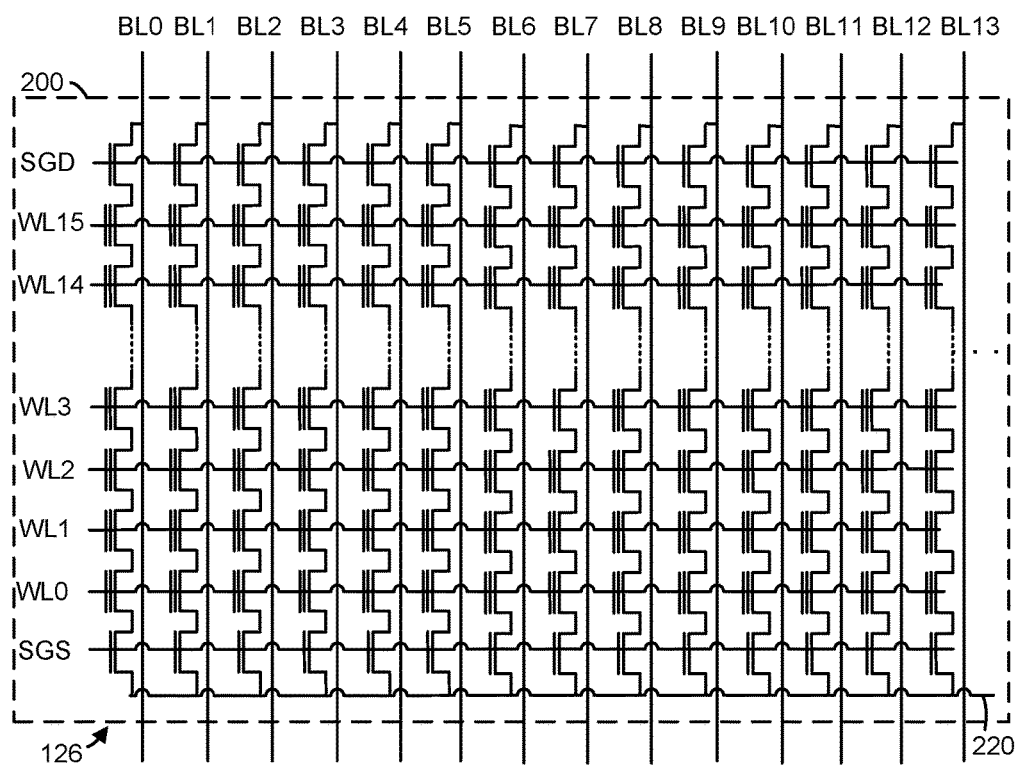
FIG. 2B depicts an example block of memory cells in an example 2D configuration of the blocks of FIG. 2A.

FIG. 2B depicts an example block of memory cells in an example 2D configuration of the blocks of FIG. 2A. The block 200 includes a number of NAND strings and respective bit lines, e.g., BL0, BL1, . . . which are shared among multiple blocks in a plane. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
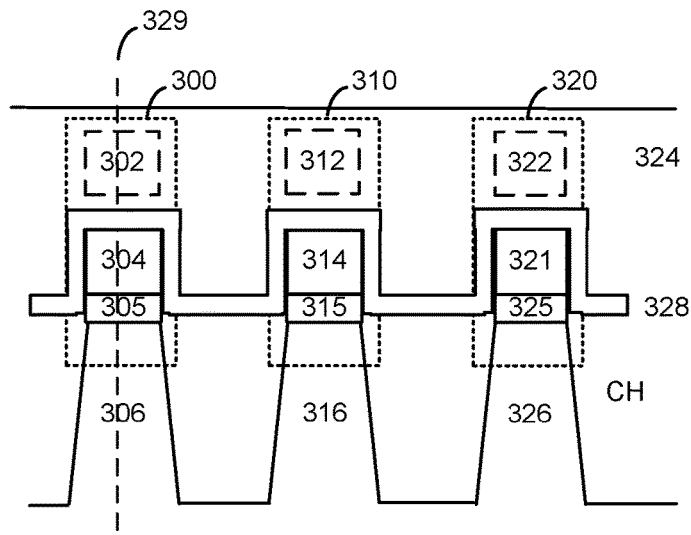
FIG. 3A depicts a cross-sectional view of example floating gate memory cells in NAND strings, as an example of memory cells in the planes of memory cells of FIG. 1B.

FIG. 3A depicts a cross-sectional view of example floating gate memory cells in NAND strings, as an example of memory cells in the planes of memory cells of FIG. 1B. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
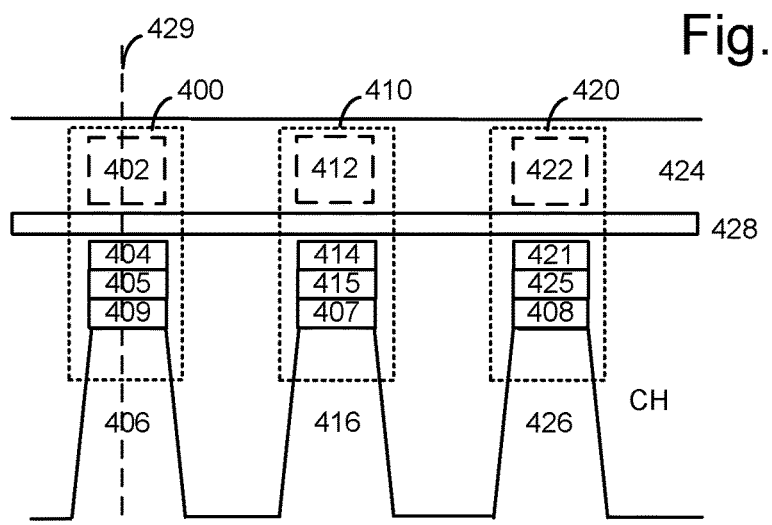
FIG. 4A depicts a cross-sectional view of example charge-trapping memory cells in NAND strings, as an example of memory cells in the planes of memory cells of FIG. 1B.
Figure 4B:
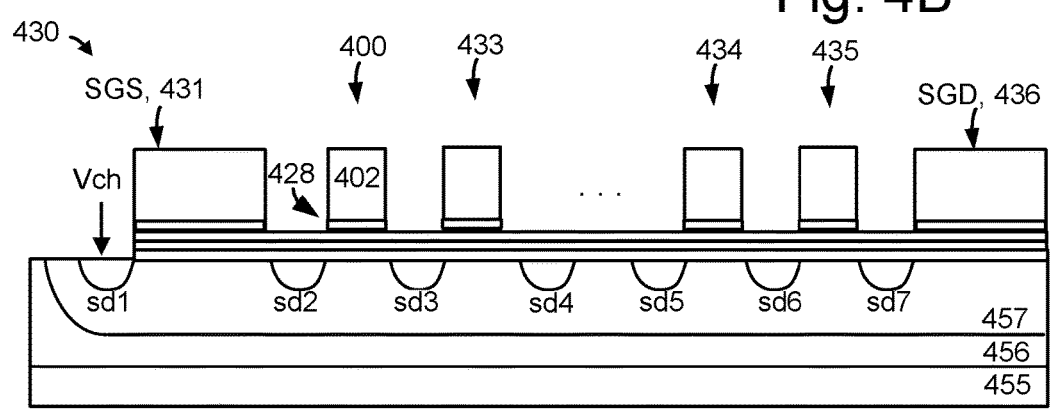
FIG. 4B depicts a cross-sectional view of the structure of FIG. 4A along line 429.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
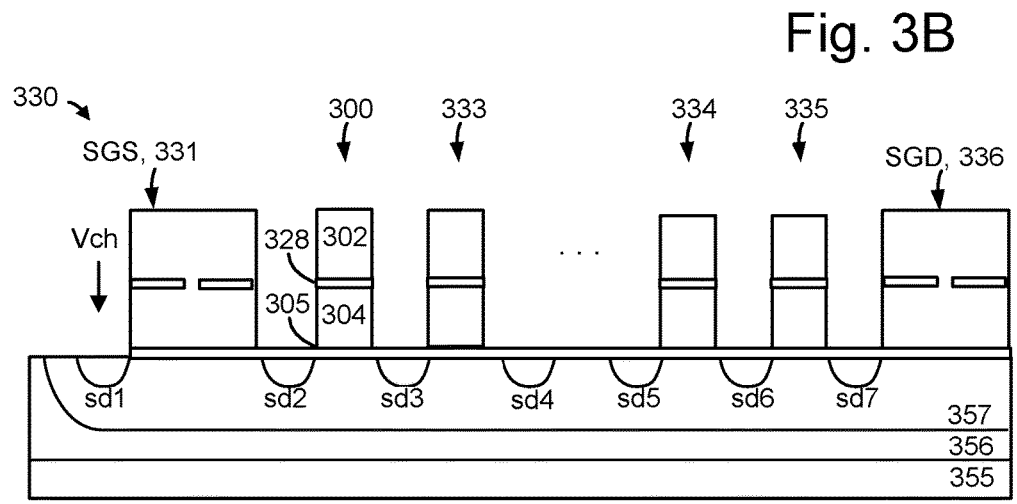
FIG. 3B depicts a cross-sectional view of the structure of FIG. 3A along line 329.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings, as an example of memory cells in the planes of memory cells of FIG. 1B. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

One advantage of a flat control gate is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5:
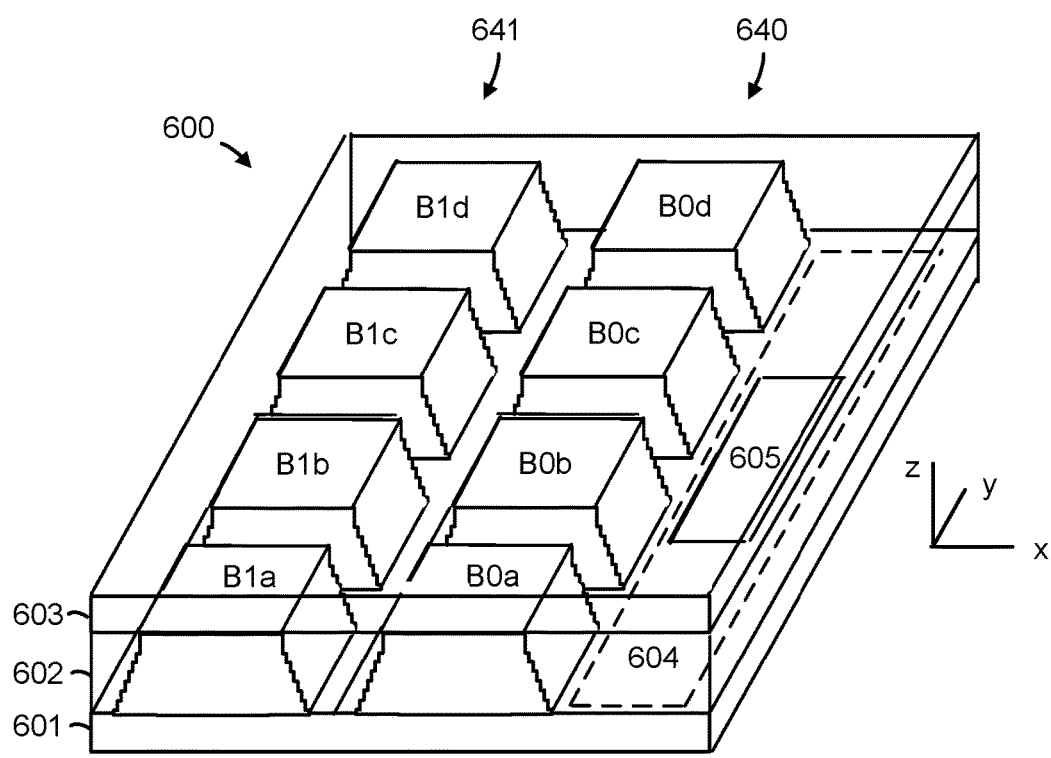
FIG. 5 is a perspective view of a memory device 600 comprising a set of blocks in an example three-dimensional configuration of the memory device of FIG. 1B.

FIG. 5 is a perspective view of a memory device 600 comprising a set of blocks in an example 3D configuration of the memory device of FIG. 1B. Two planes 640 and 641 of blocks of memory cells (storage elements) are formed on a substrate 601. The blocks are formed in an intermediate region 602 of the memory device. The plane 640 includes blocks B0a, B0b, B0c and B0d. The plane 641 includes blocks B1a, B1b, B1c and B1d.

A peripheral area 604 of the substrate includes circuitry for use by the blocks, such as voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks per plane are depicted as an example, any number of blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6A:
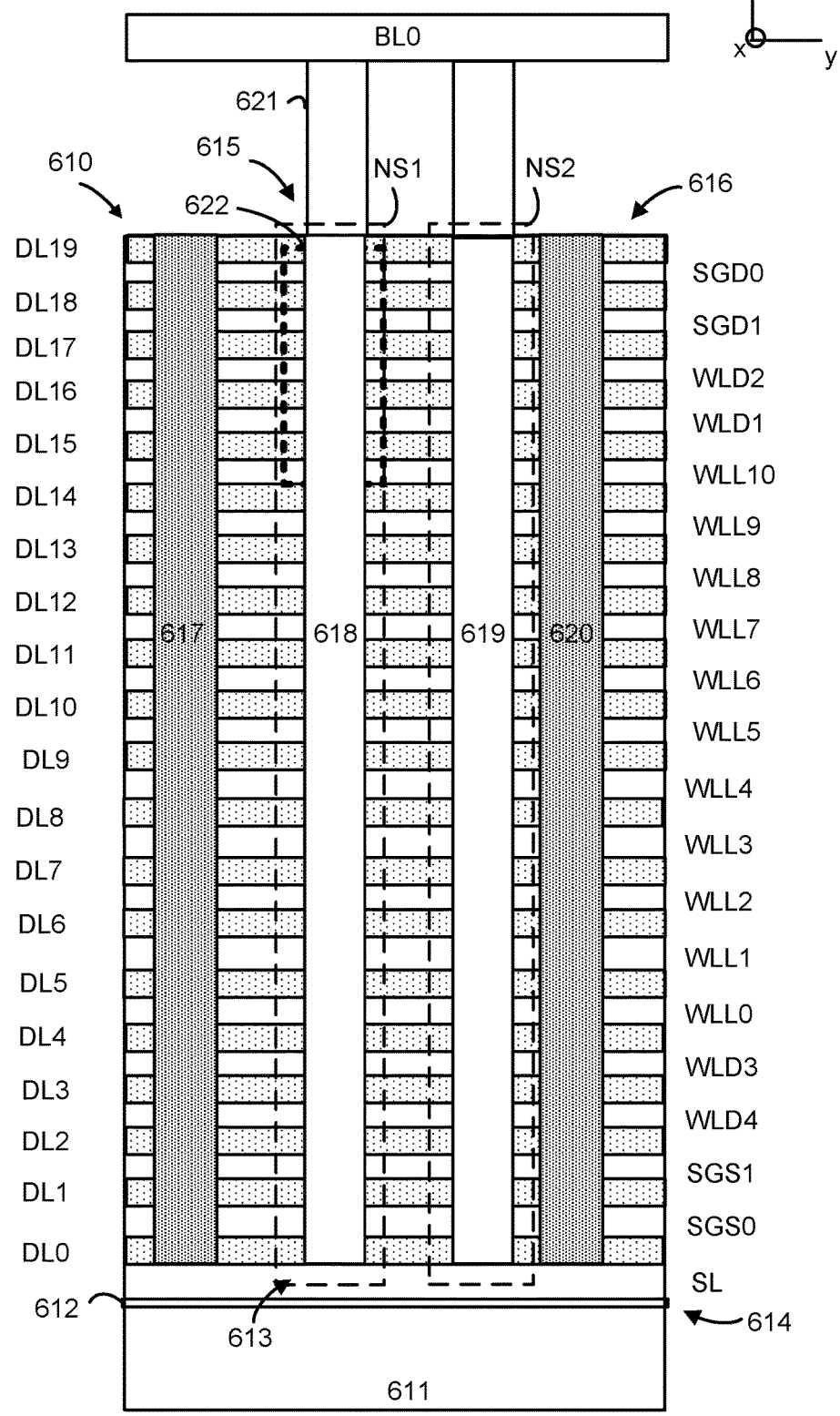
FIG. 6A depicts an example cross-sectional view of a portion of one of the blocks of FIG. 5.

FIG. 6A depicts an example cross-sectional view of a portion of one of the blocks of FIG. 5. The block comprises a stack 610 of alternating conductive and dielectric layers. In this example, the conductive layers comprise two SGD layers, two SGS layers and four dummy word line layers WLD1, WLD2, WLD3 and WLD4, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6B.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6B:
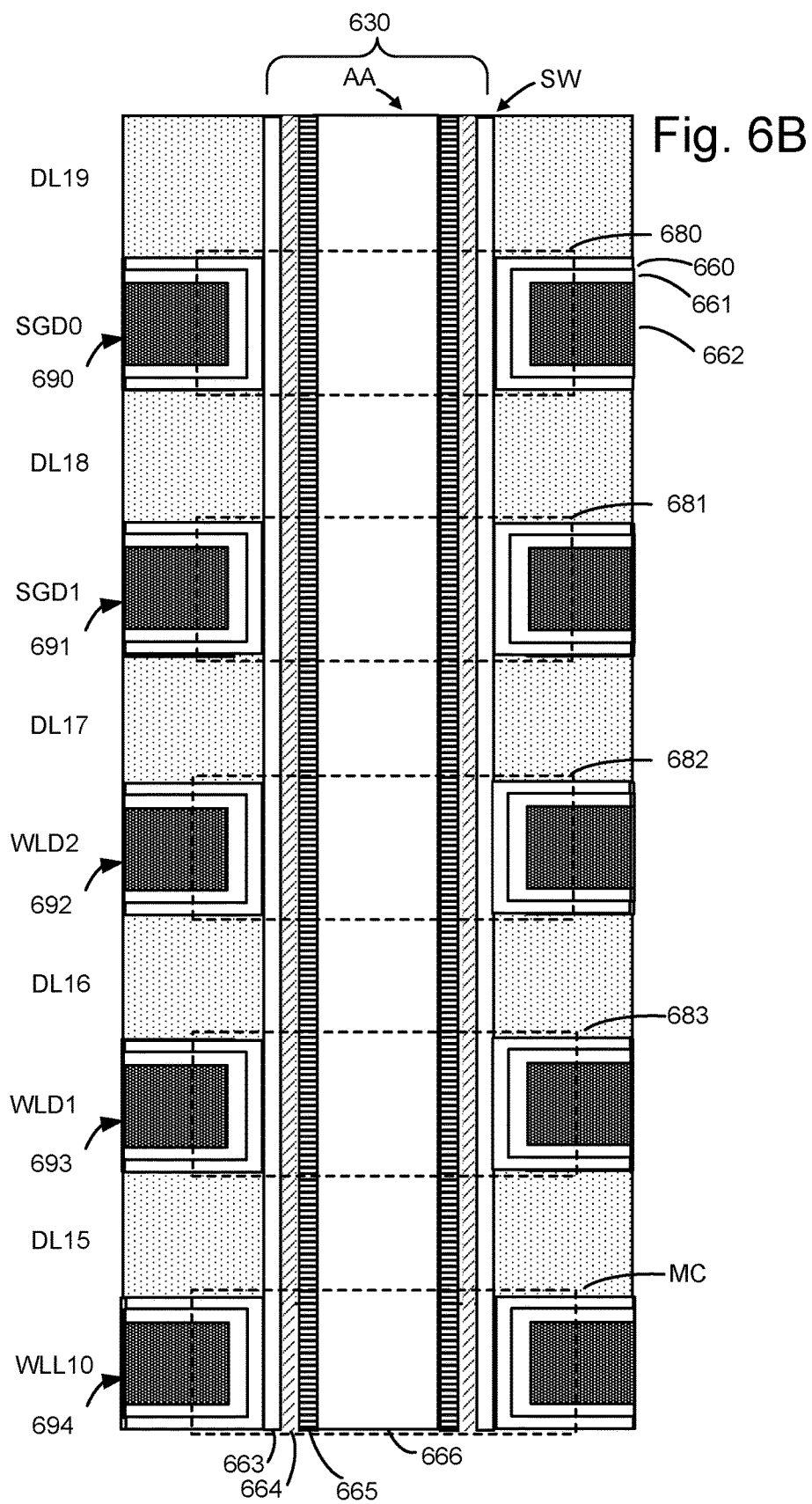
FIG. 6B depicts a close-up view of the region 622 of the stack of FIG. 6A.

FIG. 6B depicts a close-up view of the region 622 of the stack of FIG. 6A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7 depicts an example view of NAND strings in sub-blocks in a 3D configuration which is consistent with FIG. 5. The NAND strings includes NS0_SBa, NS0_SBb, NS0_SBc and NS0_SBd, which have 48 word lines, WL0-WL47, in this example. In a block BLK, each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Programming of the block may occur one sub-block at a time.

Figure 8A:
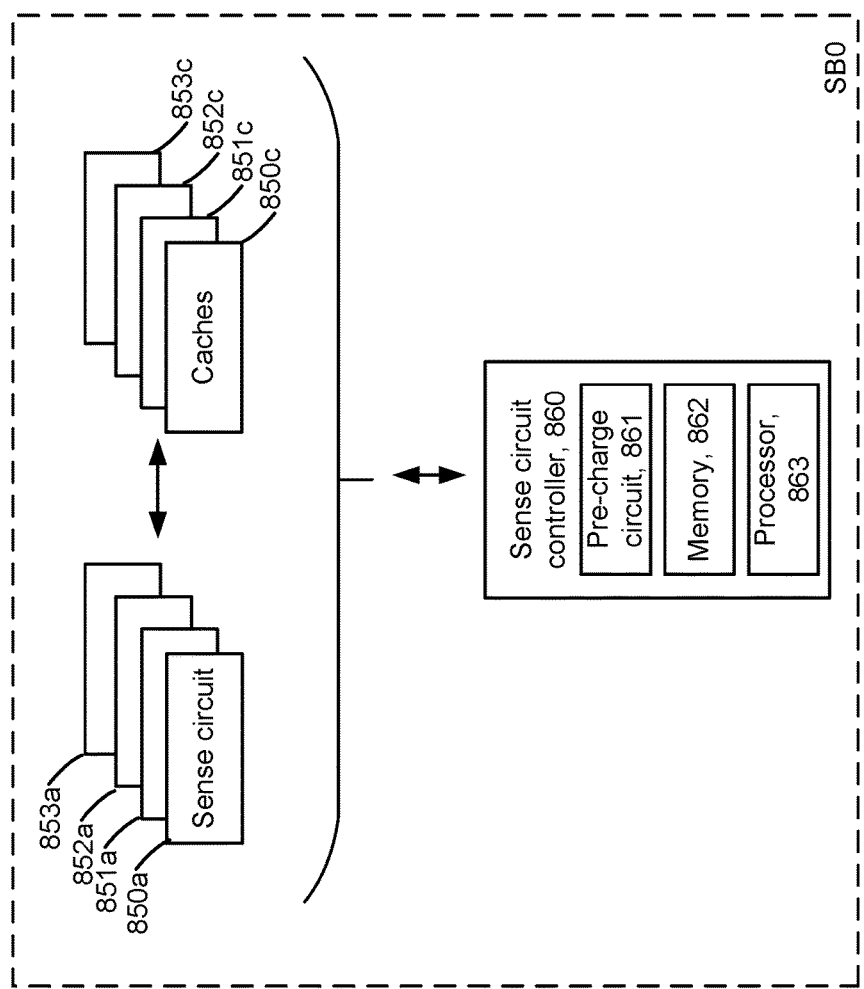
FIG. 8A depicts an example block diagram of a sense block SB0 in the column control circuitry of FIG. 1B.

FIG. 8A depicts an example block diagram of a sense block SB0 in the column control circuitry of FIG. 1B. The column control circuitry can include multiple sense blocks, where each sense block performs sensing, e.g., read, operations for multiple memory cells via respective bit lines.

In one approach, a sense block comprises multiple sense circuits, also referred to as sense amplifiers. Each sense circuit is associated with data latches and caches. For example, the example sense circuits 850a, 851a, 852a and 853a are associated with caches 850c, 851c, 852c and 853c, respectively. See also FIG. 9A for a more detailed view of a larger group of sense circuits and caches.

In one approach, different subsets of bit lines can be sensed using different respective sense blocks. This allows the processing load which is associated with the sense circuits to be divided up and handled by a respective processor in each sense block. For example, a sense circuit controller 860 can communicate with the set, e.g., sixteen, of sense circuits and latches. The sense circuit controller may include a pre-charge circuit 861 which provides a voltage to each sense circuit for setting a pre-charge voltage. In one possible approach, the voltage is provided to each sense circuit independently, e.g., via the data base 803 and a local bus such as LBUS1 or LBUS2 in FIG. 8B. In another possible approach, a common voltage is provided to each sense circuit concurrently, e.g., via the line 805 in FIG. 8B. The sense circuit controller may also include a memory 862 and a processor 863. Further example details of the sense circuit controller and the sense circuits 850a and 851a are provided below.

Figure 8B:
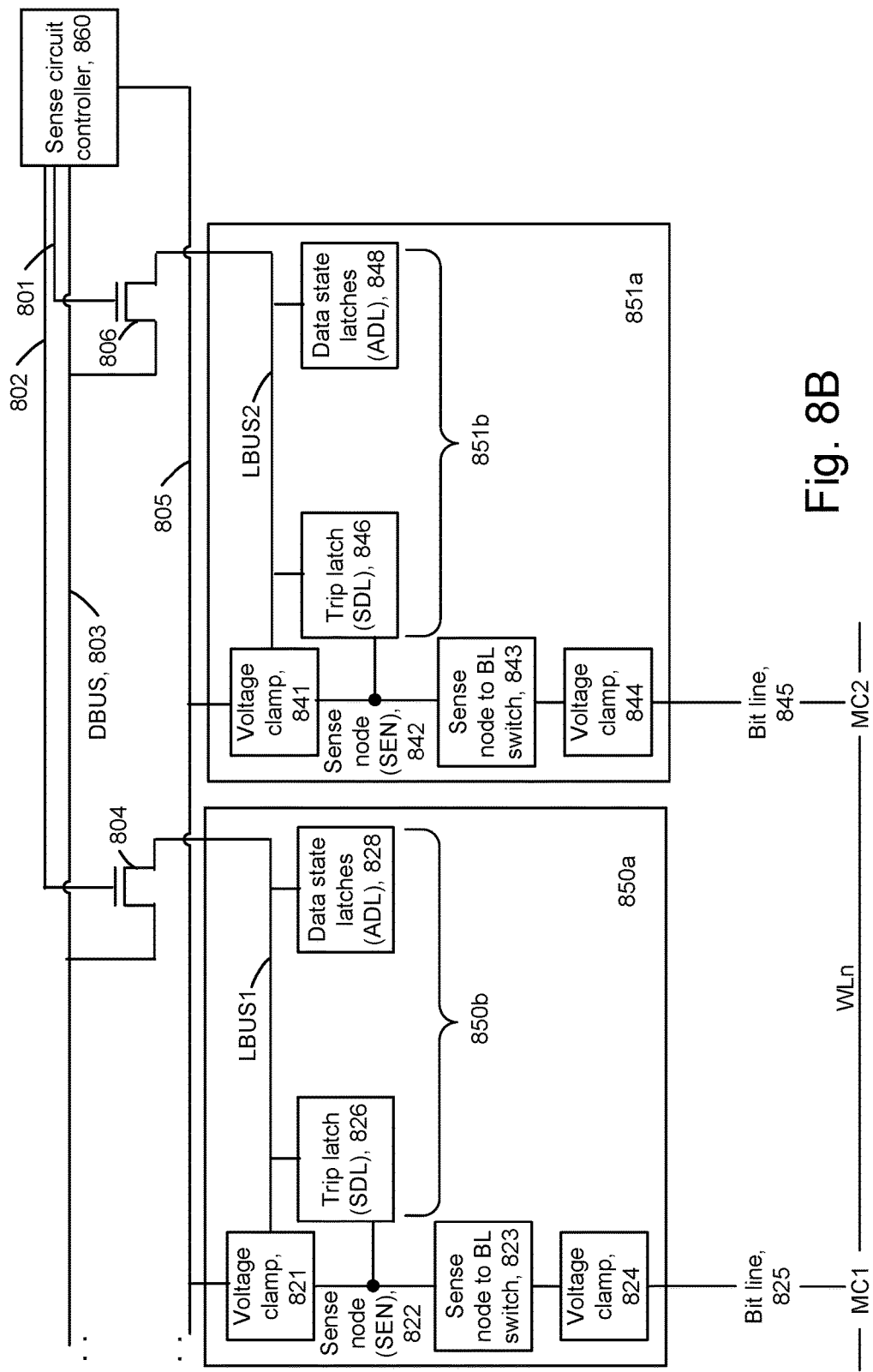
FIG. 8B depicts another example block diagram of a sense block SB0 in the column control circuitry of FIG. 1B.

FIG. 8B depicts another example block diagram of a sense block SB0 in the column control circuitry of FIG. 1B. The sense circuit controller 860 communicates with multiple sense circuits including example sense circuits 850a and 851a, also shown in FIG. 8A. The sense circuit 850a includes latches 850b, including a trip latch 826 (SDL), and data state latches 828 (ADL). The sense circuit further includes a voltage clamp 821 such as a transistor which sets a pre-charge voltage at a sense node 822 (SEN). A sense node-to-bit line (BL) switch 823 selectively allows the sense node to communicate with a bit line 825, e.g., the sense node is electrically connected to the bit line so that the sense node voltage can decay. The bit line 825 is connected to one or more memory cells, such as a memory cell MC1. A voltage clamp 824 can set a voltage on the bit line, such as during a sensing operation or during a program voltage. A local bus, LBUS1, allows the sense circuit controller to communicate with components in the sense circuit, such as the latches 850b and the voltage clamp in some cases. To communicate with the sense circuit 850a, the sense circuit controller provides a voltage via a line 802 to a transistor 804 to connect LBUS1 with a data bus DBUS, 803. The communicating can include sending data to the sense circuit and/or receive data from the sense circuit.

The sense circuit controller can communicate with different sense circuits in a time-multiplexed manner, for instance. A line 805 may be connected to the voltage clamp in each sense circuit, in one approach.

The sense circuit 851a includes latches 851b, including a trip latch 846 (SDL) and data state latches 848 (ADL). A voltage clamp 841 may be used to set a pre-charge voltage at a sense node 842 (SEN). A sense node-to-bit line (BL) switch 843 selectively allows the sense node to communicate with a bit line 845, and a voltage clamp 844 can set a voltage on the bit line. The bit line 845 is connected to one or more memory cells such as a memory cell MC2. A local bus, LBUS2, allows the sense circuit controller to communicate with components in the sense circuit, such as the latches 851b and the voltage clamp in some cases. To communicate with the sense circuit 851a, the sense circuit controller provides a voltage via a line 801 to a transistor 806 to connect LBUS2 with DBUS. The lines 801 and 802 can be considered to be sense amplifier control (sac) lines as described in FIG. 9A.

The example memory cells MC1 and MC2 are connected to a selected word line WLn.

Figure 8C:
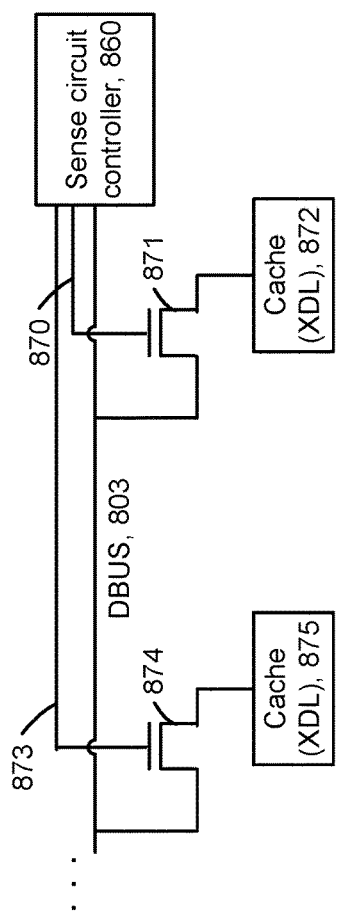
FIG. 8C depicts caches which are part of the sense block of FIG. 8B.

A cache may be associated with each sense circuit and connected to DBUS as depicted in FIG. 8C.

FIG. 8C depicts caches which are part of the sense block of FIG. 8B. Each cache (XDL) can store a bit of data and is accessible to both the sense circuits of the column control circuitry and to input/output circuitry. During a read operation, a bit of read data can be transferred to the cache from the SDL or ADL latch of a respective sense circuit. For example, a bit of read data can be transferred to the cache 875 from the SDL latch 826 or ADL latch 828 of the sense circuit 850a, and a bit of read data can be transferred to the cache 872 from the SDL latch 846 or ADL latch 848 of the sense circuit 851a.

The same sense circuit controller 860 of FIG. 8B can be used to control transfers of data to and from the caches. To provide a bit transfer involving the cache 875, the sense circuit controller provides a voltage via a line 873 to a transistor 874 to connect the cache 875 to DBUS 803. To provide a bit transfer involving the cache 872, the sense circuit controller provides a voltage via a line 870 to a transistor 871 to connect the cache 872 to DBUS 803. As described in FIG. 9A, within a sense block or cache tier, one sense amplifier and one cache at a time can be connected to DBUS to provide a bit transfer between the sense amplifier and cache (e.g., from the sense amplifier to the cache during a read operation). The lines 870 and 873 can be considered to be cache control (cc) lines as described in FIG. 9A.

Figure 9A:
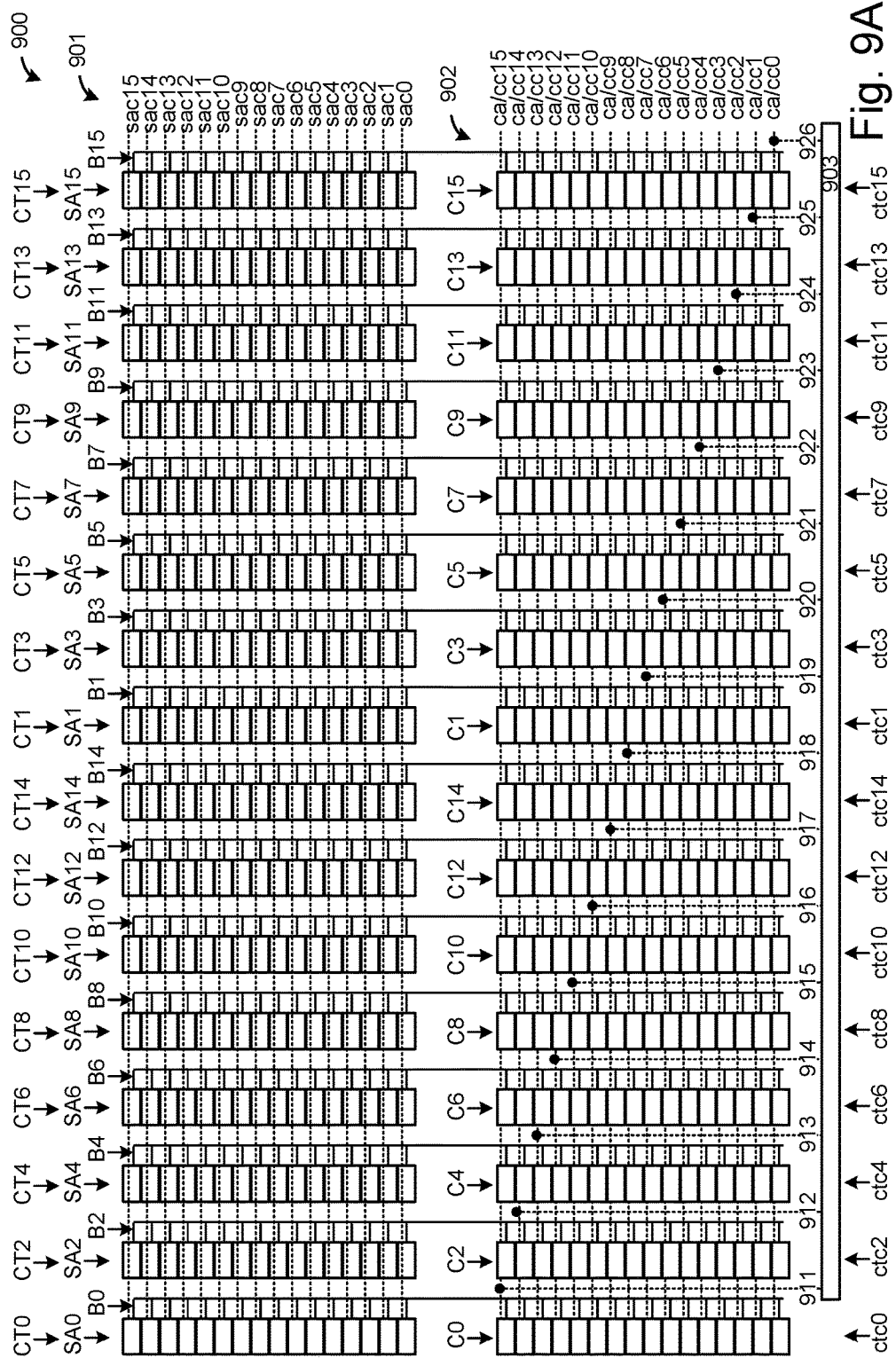
FIG. 9A depicts an example sensing circuit 900 comprising the sense circuitry of FIG. 8B and the caches of FIG. 8C arranged in sixteen cache tiers.

FIG. 9A depicts an example sensing circuit 900 comprising the sense circuitry of FIG. 8B and the caches of FIG. 8C arranged in sixteen cache tiers. The sensing circuit includes a group of sense circuits 901 and a group of caches 902. The sensing circuit is arranged in cache tiers. Each cache tier (CT) comprises a set of N sense amplifiers (SAs) and a set of N caches connected by a bus, where N is an integer. This example uses sixteen sense amplifiers and sixteen caches in a cache tier. However, other approaches are possible. One cache tier corresponds to one sense block.

Typically, data is processed in units of bytes so that the number of SAs and caches in each CT is an integer number of bytes. Further, the number of SAs and caches per CT corresponds to the number of bytes in a data word, which is a unit of data which is input to or output from the sensing circuit at a given time. In the figures, a CT includes SAs and caches which are arranged in a vertical column.

The sixteen example CTs, sets of SAs, sets of caches and associated buses are marked as follows, from left to right in the figure: CT0, SA0, C0, B0; CT2, SA2, C2, B2; CT4, SA4, C4, B4; CT6, SA6, C6, B6; CT8, SA8, C8, B8; CT10, SA10, C10, B10; CT12, SA12, C12, B12; CT14, SA14, C14, B14; CT1, SA1, C1, B1; CT3, SA3, C3, B3; CT5, SA5, C5, B5; CT7, SA7, C7, B7; CT9, SA9, C9, B9; CT11, SA11, C11, B11; CT13, SA13, C13, B13; and CT15, SA15, C15, B15.

A SA tier or row may be defined which includes a set of SAs which are connected to a common control line and extend in a row in the figure. The SA control lines are labelled sac0-sac15 and carry control signals which select or deselect a row of SAs. A SA tier includes one SA from each CT. Typically, one SA row is selected at a time.

A cache row may be defined which includes a set of caches which are connected to a common access line and extend in a row in the figure. Cache access lines and cache control lines extend across rows of caches. For simplicity here, both types of lines are represented by one line labelled ca/cc (cache access/cache control). The cache access/control lines are labelled ca/cc0-ca/cc115. The cache access lines carry input/output data to or from the caches and a multiplexer 903, which is part of input/output circuitry. A cache control line selects a cache row. Additional cache tier select lines may be used to select a cache tier. The cache tier select lines are ctc0, ctc2, ctc4, ctc6, ctc8, ctc10, ctc12, ctc14, ctc1, ctc3, ctc5, ctc7, ctc9, ctc11, ctc13 and ctc15 for selecting CT0, CT2, CT4, CT6, CT8, CT10, CT12, CT14, CT1, CT3, CT5, CT7, CT9, CT11, CT13 and CT15, respectively. Generally, one SA row and one cache row are selected at a time, and one or more cache tiers may be selected at a time.

A cache row includes one cache from each CT. Typically, a SA control line is set high, for instance, to allow the SA and to communicate via a respective bus. A corresponding cache can be selected in the same cache tier to send or receive data. This allow an SA to receive a bit of data from a cache or to send a bit of data to a cache, concurrently within each cache tier. Each cache may store one bit of data.

A multiplexer 903 may have a 16 bit width to concurrently transfer one bit to or from each cache in a selected cache tier. The set of caches in a cache tier may be selectable via control signals so that one set of caches at a time is selected and connected to the cache control lines.

Multiplexer input/output paths 911-926 or lines are connected to the cache access lines, one input/output path per cache access line.

The different caches tiers may store data for a first sub-page (sub-page0) or a second sub-page (sub-page1). For example, CT0, CT2, CT4 and CT6, CT1, CT3, CT5 and CT7 may store data for sub-page0, and CT8, CT10, CT12 and CT14, CT9, CT11, CT13 and CT15 may store data for sub-page1.

In one approach, two of the sense circuits 900 are provided. One sensing circuit is a left hand side and the other sensing circuit is a right hand side.

FIG. 9B depicts an example sensing circuit and input/output circuitry consistent with FIG. 9A. The sensing circuit 961 includes a set of bits lines 940, sense circuits 941, data buses 942 (DBUS), and user caches 943. An input/output circuit 960 comprises input/output paths 945, a logic circuit 944 and buses 946 for communicating with an external host, external to the memory chip. The buses may extend to I/O pads on the chip. In one approach, a bit size of the input/output paths in bits is equal to a bit size of a word. The transfer of data to and from the sense circuits may occur separately for each page of data.

FIG. 9C depicts an example transfer of data between the sense amplifiers and the caches of the cache tier CT0 of FIG. 9A in a read operation. The caches are labelled cache(0) to cache(15) in a set of caches C0 and the SAs are labeled SA(0) to SA(15) in a set of SAs SA0. In the read process, a bit is transferred to cache(0) in CT(0) from SA(0) in CT(0), then a bit is transferred to cache(1) in CT(0) from SA(1) in CT(0), and so forth. The data transfers all occur using the bus DBUS. This figure also depicts the SA control lines sac0-sac15, the cache control lines cc0-cc15, the cache access lines ca0-ca15 and a cache tier selection line ctc0 (which may carry a control signal which selects the cache tier CT0 and the set of caches C0).

FIG. 10A depicts bit sequences for different data states and for lower, middle and upper pages of data, and associated read voltages. In this case, the memory cells each store three bits of data in one of eight data states. Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state, its threshold voltage (Vth) is less than the read voltage. If the memory cell is in a non-conductive state, its Vth is greater than the read voltage. See also FIG. 10G to 10I.

The read voltages which are used to read a page of data are determined by transitions from 0 to 1 or 1 to 0 in the encoded bits (code word) for each state. For example, referring to the encoded bits of FIG. 10C, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, referring to the encoded bits of FIG. 10C, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, referring to the encoded bits of FIG. 10C, the UP bit transitions from 1 to 0 between B and C, and from 0 to 1 between F and G. Accordingly, the read voltages for the UP are VrC and VrG.

FIG. 10B depicts an initial threshold voltage distribution 1000 in which all memory cells are in the erased state.

FIG. 10C depicts a final threshold voltage distribution in which some memory cells remain in the erased state while other memory cells are programmed to one of seven different programmed data states, consistent with FIG. 10A. The final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state. For example, the verify voltages of the A, B, C, D, E, F and G states are VvA, VvB, VvC, VvD, VvE, VvF and VvG, respectively. The A, B, C, D, E, F and G states are represented by the Vth distributions 1001, 1002, 1003, 1004, 1005, 1006 and 1007, respectively, and an example encoding of bits for each state is 111, 110, 100, 000, 010, 011, 001 and 101, respectively. The read voltages VrA, VrB, VrC, VrD, VrE, VrF and VrG, consistent with FIG. 10A, are also depicted.

Programming using four bits per cell (16 levels) can similarly involve lower, lower-middle, upper-middle and upper pages.

FIG. 10D depicts a Vth distribution 1010 of memory cells in an erased state (Eslc) and a Vth distribution 1011 comprising memory cells in a programmed data state (Pslc), in an example of single-level cell (SLC) programming. The erased state may represent a one bit while the programmed state represents a zero bit, for example. A verify voltage for the programmed state is VvSLC and a read voltage for distinguishing between the two states is VrSLC.

Figure 10E:
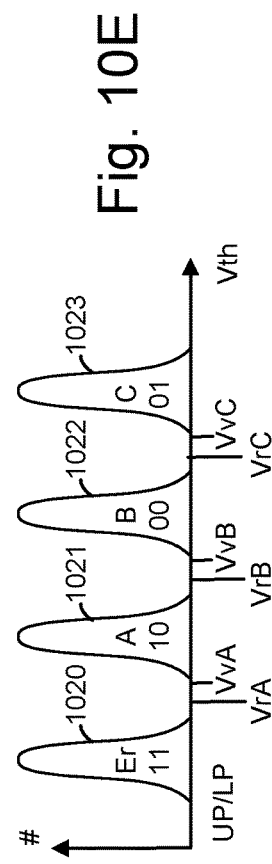
FIG. 10E depicts example Vth distributions of memory cells, where four data states are used.

FIG. 10E depicts example Vth distributions of memory cells, where four data states are used. The data states are represented by Vth distributions 1020, 1021, 1022 and 1023 for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB.

Figure 10F:
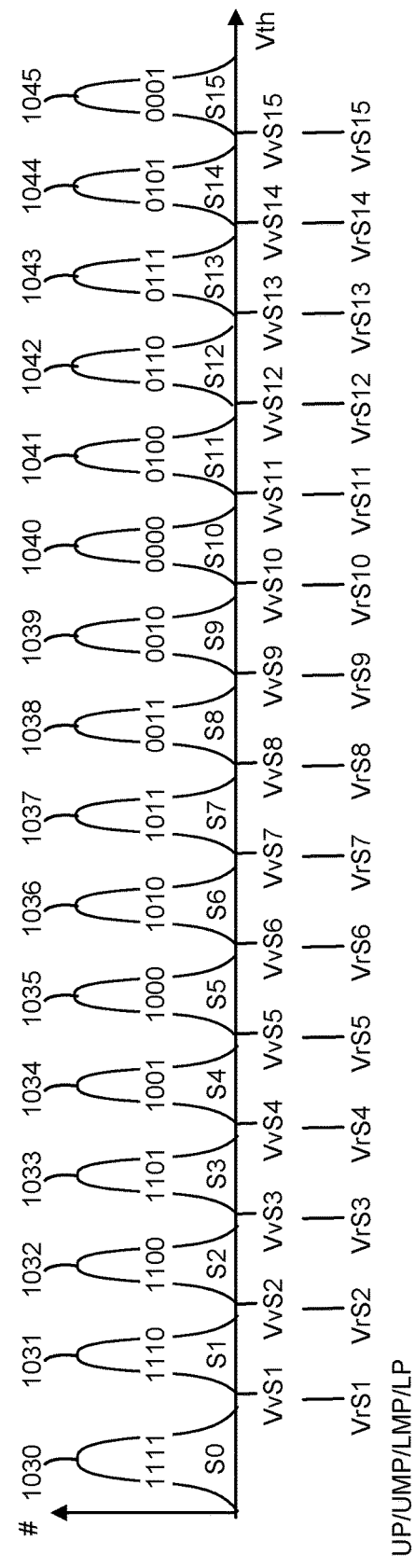
FIG. 10F depicts example Vth distributions of memory cells, where sixteen data states are used.

FIG. 10F depicts example Vth distributions of memory cells, where sixteen data states are used. The data states are represented by Vth distributions 1030, 1031, 1032, 1033, 1034, 1035, 1036, 1037, 1038, 1039, 1040, 1041, 1042, 1043, 1044 and 1045 for the S0, S1, S2, S3, S4, S5, S6, S7, S8, S9, S10, S11, S12, S13, S14 and S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit, as depicted. The verify voltages are VvS1, VvS2, VvS3, VvS4, VvS5, VvS6, VvS7, VvS8, VvS9, VvS10, VvS11, VvS12, VvS13, VvS4 and VvS15. The read voltages are VrS1, VrS2, VrS3, VrS4, VrS5, VrS6, VrS7, VrS8, VrS9, VrS10, VrS11, VrS12, VrS13, VrS4 and VrS15.

A LP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

FIG. 10G depicts example bit values assigned after a read operation of a lower page using VrA, consistent with FIG. 10A. In this example, cells with a Vth<=VrA are assigned a 1, and cells with a Vth>VrA are assigned a 0. This is an intermediate read result.

FIG. 10H depicts example bit values assigned after a read operation of a lower page using VrE, consistent with FIG. 10A. In this example, cells with a Vth<=VrE are assigned a 0, and cells with a Vth>VrE are assigned a 1. This is an intermediate read result.

FIG. 10I depicts example bit values obtained by combining the bit values from the read operations of FIGS. 10G and 10H. For example, an exclusive OR (XOR) logical operation may be performed. As a result, the lower page (LP) bit=1 if Vth<=VrA or Vth>VrE. LP=0 if VrA<Vth<=VrE. Generally, a final read result which identifies the data state of a cell can be obtained from logical operations performed on multiple intermediate read results.

FIG. 11A depicts an example read process in a multi-plane memory device. The techniques described herein allow an external controller to execute multi-plane read operations without any restrictions of page or word line address on each plane. Also, SLC read latency can be reduced in a hybrid read mode in which SLC cells are read in one plane while multi-level cells are read in another plane. This approach provides better system level performance due to more parallelism in the read operations. It also enables the use of higher density memory dies in products that require better read performance. It also reduces the worst case SLC read latency to one-third of its previous value while reducing the negative impact of hybrid SLC read mode on bit error rate and endurance.

Specifically, the read operations in one plane can disturb the Vth level of SLC cells in another plane, so that bit error rate on an SLC page can be higher when read in the hybrid mode. To adjust for this, the Vth of the programmed state can be made higher. However, this reduces the endurance of the SLC block. The techniques provided herein read out the SLC data sooner so there is less of a chance for the Vth to be disturbed.

Step 1100 is the start of a read operation. In step 1101, the external controller issues a read command and addresses for reading of multiple planes, e.g., selected planes, for which a read operation is desired. For example, the read command and addresses can be provided to a state machine. The read command can identify a read type such as the types of pages to read (e.g., lower, middle, upper, single level cell). In one approach, different planes have different read types. For example, there may be multiple planes comprising a first plane and a second plane, where the type of read to be performed in each of the multiple planes comprises a first page type in the first plane and a second page type in the second plane, and the first page type comprises a middle page and the second page type comprises a lower or upper page, or the first page type comprises a middle page and the second page type comprises a single level cell (SLC) page.

At step 1101a, the external controller may set values in registers for the multiple planes. In one approach, each plane has a dedicated set of registers which is updated with values in each read command. The values indicate read voltages to be used in reading a selected word line of a plane, to obtain bits of a specified page type. The values in the register can be updated for each different page type which is read. Since each plane has a dedicated set of registers, the values can be customized for each plane, e.g., to account for different characteristics of different blocks in different planes, such as the number of program-erase cycles. See also FIG. 11C1 to 11H.

Addresses for row control circuitry may identify a selected word line in a selected block, and addresses for column control circuitry may select all or a portion of a word line. For example, if multiple pages of data are stored in a word line, the addresses may identify the portion of a word line which stores one page of data. In step 1102, the state machine sets a busy status and instructs the row and column control circuitry of each selected plane to perform sensing of memory cells of a selected word line using a respective read voltage. Concurrent read operations may be performed on some or all planes. Different ready voltages may be used on different selected word lines based on different read types.

At step 1102a, the state machine reads the values from the registers and, based on these values, determines read voltages for each plane. For example, a value can be a binary code word which denotes a read voltage or an offset voltage which can be added to a reference voltage to obtain a read voltage. Each value can be mapped to a read voltage. See also FIG. 11C1.

For instance, for a read of a lower page, the state machine may instruct the row control circuitry to provide read voltages of VrA and VrE on the selected word line. For a read of a middle page, the state machine may instruct the row control circuitry to provide read voltages of VrB, VrD and VrF on the selected word line. For a read of an upper page, the state machine may instruct the row control circuitry to provide read voltages of VrC and VrG on the selected word line. The column control circuitry is instructed to perform sensing during each read voltage.

At step 1103, the read data is stored in the sense circuits as part of the sensing process. For example, the read data for each memory cell can be a bit which indicates whether the cell was sensed to be in a conductive or non-conductive state. Decision step 1104 determines whether the read operation is complete on any of the planes. If decision step 1104 is false, step 1102 is repeated to perform sensing using the next read voltage. If decision step 1104 is true, decision step 1105 is reached. Decision step 1105 determines whether data is being output to the external controller from the caches of a plane. If decision step 1105 is false, step 1108 is reached. Step 1108 involves scanning, e.g., transferring, read data from the sense circuits to the caches and releasing the caches, for the planes with a completed read. A released cache is not currently being used by the state controller and is available for outputting data to the external controller.

After step 1108, steps 1109-1112 follow and step 1102 also follows if some reads are incomplete, i.e., one or more planes have not completed their read operation. The state machine sets a ready status at step 1109. At step 1110, the external controller detects the ready status and, in response, issues a check status command to the state machine. At step 1111, the state machine provides a status message, e.g., status data, to the external controller identifying one or more planes are being ready to output data. These are the planes for which the cache release occurred at step 1108. At step 1112, the external controller provides a command to the state machine to output data and begins to output data from the caches of a selected plane.

If decision step 1105 is true, step 1106 is reached. Step 1106 involves waiting for a command from the external controller. In step 1107, the external controller provides a command to the state machine to scan read data from the sense circuits to the caches and release the caches, for the planes with a completed read. This occurs for one or more planes which completed their read operation and have not yet transferred their read data from sense circuits to caches. The state machine waits for the external controller to instruct it to perform the scan to the caches because the external controller may be outputting data from the caches of a plane so that the caches are not available to the state machine.

When read data is being transferred from the sense circuits to the caches in a plane, the caches in that plane and other planes are not available to output data to the external controller. Further, the state machine is in a state for data transfer, and this state applies for all planes. When read data has completed its transfer from the sense circuits to the caches, the caches are available to output data to the external controller. The state machine is in a state which releases the caches. In one approach, the caches from only one plane at a time can output data to the external controller.

In example implementations of FIG. 11A, for an SLC read, the read voltage of the read operation is VrSLC. For a lower page read, the order of the read voltages can be Vr,A then VrE. For a middle page read, the order of the read voltages can be VrB, VrD then VrF. For an upper page read, the order of the read voltages can be VrC then VrG.

FIG. 11B depicts example states of a state machine in the read process of FIG. 11A. In an example implementation, the state machine is configured to enter one state at a time among a plurality of available states, and to control each of the multiple planes according to a current state of the planes among the plurality of available states. The plurality of available states may comprise a state (S1) for transferring read data from sense circuits of row and column circuitry to caches of row and column circuitry, a state (S2) for releasing caches to allow data output from the caches to the external controller, a state (S3) for transferring read data between latches of sense circuits and a state (S4) for reading values in registers. Note that the ready or busy status can be set during different states. For example, the busy status may be set during S1 and S3 while the ready status is set during S2, in one possible implementation.

FIG. 11C1 depicts an example of registers which store values which indicate read voltages, where the registers are mapped to data states and the same registers are shared by different planes, for an eight state memory device, consistent with FIG. 11G. Each register is represented by a byte of data for instance. A set of registers has an address which allows the state machine to read values in the set of registers. For example, an address addr1 is associated with four registers represented by bytes B0-B3 in a set of registers 1120, an address addr2 is associated with four registers represented by bytes B0-B3 in a set of registers 1121, and an address addr3 is associated with two registers represented by bytes B0 and B1 in a set of registers 1122, where B1 contains null data. Null data is denoted by a double dash in this and other figures. Each set of registers is used by the planes P0 and P1. Under addr1, bytes B0, B1, B2 and B3 provide values which indicate (are used to identify or provide) VrA, VrE, VrC and VrG, respectively. Under addr2, bytes B0, B1, B2 and B3 provide values which indicate VrB, VrD and VrF, respectively. Under addr3, bytes B0 and B1 provide values which indicate Vrslc and null data, respectively.

To obtain the read voltages for an LP read, the state machine reads the registers under addr1 and uses the values in the first and second registers to obtain VrA and VrE, respectively. To obtain the read voltages for a MP read, the state machine reads the registers under addr2 and uses the values in the first, second and third registers to obtain VrB, VrD and VrG, respectively. To obtain the read voltages for an UP read, the state machine uses the values in the third and fourth registers which were previously read in under addr1 to obtain VrC and VrG, respectively. To obtain the read voltage for an SLC read, the state machine reads the registers under addr3 and uses the value in the first register to obtain Vrslc. In one approach, the state machine has registers corresponding to one or more of the sets of registers 1120, 1121 and 1122.

In this approach, the different planes use the same read voltage for a given data state. For example, the same VrA and VrE are used in a LP read of P0 and P1. If it were desired to use a different VrA and VrE in P0 and P1, the register would first be updated with the VrA and VrE for P0. The state machine would read in the value for VrA and VrE and cause the circuitry of P0 to apply VrA and VrE to a selected word line in P0. Then, after the read of P0 was completed, the register would be updated with a new VrA and VrE for P1. The state machine would read in the new value for VrA and VrE and cause the circuitry of P1 to apply the new VrA and VrE to a selected word line in P1. This sequential read approach increases the read time significantly.

FIG. 11C2 depicts a flowchart of a process in which data is stored in registers and read by a state machine, consistent with steps 1101*a* and 1102*a* of FIG. 11A. In this approach, the sets of registers can be updated based on the page type which is currently being read. Further, separate values can be provided for different planes, e.g., first and second planes in this example. The registers can be updated and read by the state machine before each read of a multi-read operation for a given page type of data.

At step 1123, the external controller stores values in the registers for each plane based on a page type, e.g., the page type of the current read operation. At step 1124, the state machine reads the values in the registers and determines a set of one or more read voltages for each plane. A read of each plane is then performed in each plane using the read voltages (step 1125). The read operations on the different planes are concurrent, at least in part. A decision step 1126 determines if there is a next page type in the read operation. If the decision step is true, step 1123 is repeated by the external controller storing values in the registers for each plane based on the next page type. The registers which store the SLC value may store data only once since there is only one read voltage in the read operation. If the decision step is false, the process is done at step 1127.

For example, in an eight state device, a LP is followed by a MP read and then an UP read. The registers are firstly updated with values for the LP for P0 and P1. The values can be separate for each plane so that customized read voltages are provided for each plane. The state machine reads in these values to determine read voltages to apply to a selected word line. After the LP read, the registers are secondly updated with values for the MP for P0 and P1 and the state machine reads in these values to determine respective read voltages. After the MP read, the registers are thirdly updated with values for the UP for P0 and P1 and the state machine reads in these values to determine respective read voltages. The new values may overwrite the previous values in the registers, in one approach. Further details of register values for an eight, four and sixteen state memory device are provided in FIGS. 11D, 11E and 11F, respectively.

FIG. 11D1 depicts another example of registers which store values which indicate read voltages, where the registers are mapped to a series of voltages in a particular page type of a read operation, and separate sets of registers are provided for different planes, for an eight state memory device, consistent with FIG. 11H. Sets of registers 1130, 1131 and 1132 correspond to the sets of registers 1120, 1121 and 1122, respectively, in FIG. 11C2. The set of registers 1130 has the address addr1 and stores first, second and third read values in bytes B0, B1 and B2, respectively, for plane P0. The byte B3 may store null data or other specified bit sequence which indicates that there is no further read voltage to be used. The set of registers 1131 has the address addr2 and stores first, second and third read values in bytes B0, B1 and B2, respectively, for plane P1. The set of registers 1132 has the address addr3 and stores values in B0 and B1 for P0 and P1, respectively. The examples here can be extended to more than two planes with the use of an appropriate number of registers.

To provide a LP, MP or UP read in P0, the set of registers of addr1 have a configuration as depicted in the set of registers 1130a, 1130b and 1130c, respectively. The set of registers 1130a provide VrA and VrE in B0 and B1, respectively. The set of registers 1130b provide VrB, VrD and VrF in B0, B1 and B2, respectively. The set of registers 1130c provide VrC and VrG in B0 and B1, respectively.

To provide a LP, MP or UP read in P1, the set of registers of addr2 have a configuration as depicted in registers 1131a, 1131b and 1131c, respectively. The set of registers 1131a provide VrA and VrE in B0 and B1, respectively. The set of registers 1131b provide VrB, VrD and VrF in B0, B1 and B2, respectively. The set of registers 1131c provide VrC and VrG in B0 and B1, respectively. Even when the same page type is used in P0 and P1, the read voltages can differ. For example, VrA for P0 in the set of registers 1130a can be different than VrA for P1 in the set of registers 1131a. This provides flexibility and customization.

Generally, any combination of page types can be read concurrently in different planes. For example, the page type for P0 can be any of LP, MP, UP and SLC and the page type for P1 can be any of LP, MP, UP and SLC.

For P0, for instance, the state machine reads the registers for addr1 and causes the circuitry for P0 to apply the read voltages to a selected word line in P0 according to the order of the values in the registers until no further read voltages are to be applied. The presence of a null byte may signal to the state machine that no further read voltages are to be applied in the read operation for the current page type.

In an example embodiment, an apparatus comprises: a first plane (P0) comprising memory cells; a second plane (P0) comprising memory cells; a first set of registers 1130; a second set of registers 1131; and a controller (e.g., external controller 26). The controller is configured to store values in the first set of registers in connection with a first read command for a selected word line of the first plane, and store values in the second set of registers in connection with a second read command for a selected word line of the second plane, the values in the first set of registers indicate a set of read voltages according to a first page type (e.g., LP, MP, UP or SLC) of the first read command, and the values in the second set of registers indicate a set of read voltages according to a first page type (e.g., LP, MP, UP or SLC) of the second read command. The first page type of the first read command can be the same or different than the first page type of the second read command. The values in the registers comprise data from which the read voltages are derived. One example of this data is read voltage shift values. This data represents a voltage shift or offset from a baseline voltage, in one example.

The first page type of the first read command and the first page type of the second read command can be a same page type, or different pages types. The second page type of the first read command and the second page type of the second read command can be a same page type, or different pages types. The read voltages indicated by the values in the first set of registers can be different than the read voltages indicated by the values in the second set of registers, even when the page types are the same.

Figure 12A:
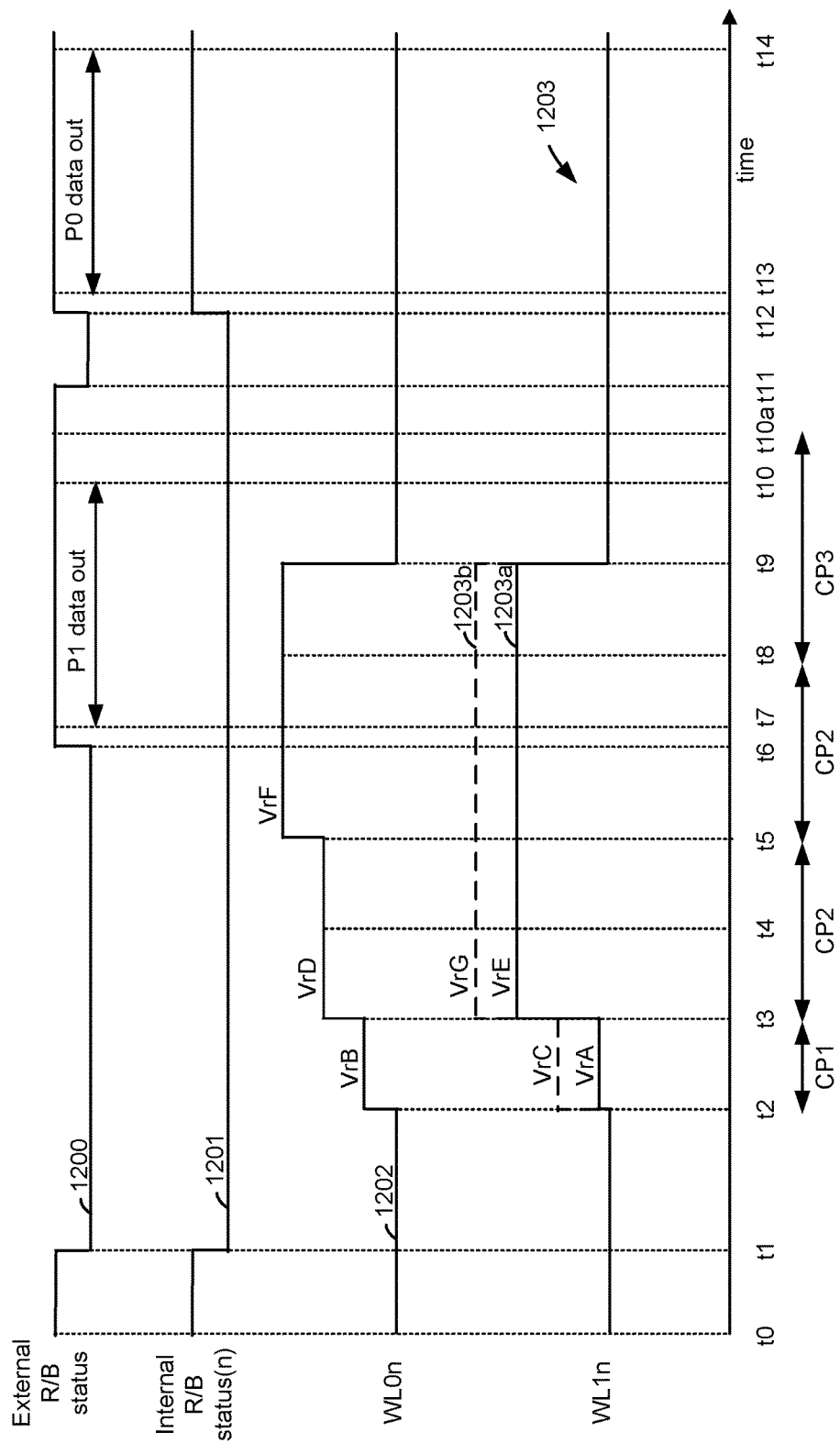
FIG. 12A depicts waveforms of an example read operation in which a middle page is read from one plane and a lower or upper page is read from another plane.

FIG. 11D2 depicts an example sequence of commands and events in a read operation, consistent with FIGS. 11D1 and 12A. Assume a MP read is performed in P0 (e.g., on a selected word line WL0n) and a LP read is performed in P1 (e.g., on a selected word line WL1n). Subsequently, a UP read is performed in P0 on WL0n and a MP read is performed in P1 on WL1n. The sequence is represented by blocks 1190a-1190e and 1191a-1191e. Block 1190a provides for P0: a first read command including first page type (MP) values for P0 registers and a P0 WL address. Block 1190b provides for P1: a first read command including first page type (LP) values for P1 registers and a P1 WL address. Block 1190c indicates the state machine reads the first page type values from P0 and P1 registers, and reads the P0 and P1 WL addresses. Block 1190d indicates that the state machine determines read voltages for P0 (VrB, VrD, VrF) and P1 (VrA, VrE). Block 1190e indicates that the state machine causes P0 and P1 circuitry to apply respective read voltages to respective WLs and sense the associated cells.

Block 1191a provides for P0: a second read command including second page type (UP) values for P0 registers and a P0 WL address. Block 1191b provides for P1: a second read command including second page type (MP) values for P1 registers and a P1 WL address. Block 1191*c* indicates the state machine reads the second page type values from P0 and P1 registers, and reads the P0 and P1 WL addresses. Block 1191*d* indicates that the state machine determines read voltages for P0 (VrC, VrG) and P1 (VrB, VrD, VrF). Block 1191*e* indicates that the state machine causes P0 and P1 circuitry to apply respective read voltages to respective WLs and sense the associated cells.

FIG. 11E depicts another example of registers which store values which indicate read voltages, where the registers are mapped to a series of voltages in a particular page type of a read operation, and separate sets of registers are provided for different planes, for a four state memory device, consistent with FIG. 11H. This example is consistent with the Vth distribution of FIG. 10E.

The set of registers 1140 has the address addr1 and stores first and second read values in bytes B0 and B1, respectively, for plane P0. Null values can be stored in B2 and B3 or these extra registers can be removed. The set of registers 1141 has the address addr2 and stores first and second read values in bytes B0 and B1, respectively, for plane P1. Null values can be stored in B2 and B3 or these extra registers can be removed. The set of registers 1142 has the address addr3 and stores a read value in byte B0 for plane P0, and a value in byte B1 for plane P1.

To provide a LP or UP read in P0, the set of registers of addr1 have a configuration as depicted in the set of registers 1140*a* and 1140*b*, respectively. The set of registers 1140*a* provide VrB in B0, and the set of registers 1140*b* provide VrA and VrC in B0 and B1, respectively. To provide a LP or UP read in P1, the set of registers of addr1 have a configuration as depicted in the set of registers 1141*a* and 1141*b*, respectively. The set of registers 1141*a* provide VrB in B0, and the set of registers 1141*b* provide VrA and VrC in B0 and B1, respectively.

Any combination of page types can be read in the different planes. For example, the page type for P0 can be any of LP, UP and SLC and the page type for P1 can be any of LP, UP and SLC.

FIG. 11F depicts another example of registers which store values which indicate read voltages, where the registers are mapped to a series of voltages in a particular page type of a read operation, and separate sets of registers are provided for different planes, for a sixteen state memory device, consistent with FIG. 11H. This example is consistent with the Vth distribution of FIG. 10F. In this example, eight registers are provided in the sets of registers 1150 and 1151 associated with addr1 and addr2, respectively. Two registers are provided in the set of registers 1152, consistent with the sets of registers 1132 and 1142, discussed previously.

The set of registers 1150 has the address addr1 and stores first, second, third, fourth, fifth and sixth read values in bytes B0, B1, B2, B3, B4 and B5, respectively, for plane P0. The bytes B6 and B7 may store null data or other specified bit sequence which indicates that there is no further read voltage to be used. The set of registers 1151 has the address addr1 and stores first, second, third, fourth, fifth and sixth read values in bytes B0, B1, B2, B3, B4 and B5, respectively, for plane P1. The set of registers 1152 has the address addr3 and stores a read value in byte B0 for plane P0, and a value in byte B1 for plane P1.

To provide a LP, LMP, UMP or UP read in P0, the set of registers of addr1 have a configuration as depicted in the set of registers 1150*a*, 1150*b*, 1150*c* and 1150*d*, respectively. The set of registers 1150*a* provide VrS1, VrS3, VrS5, VrS7, VrS9 and VrS13 in B0, B1, B2, B3, B4 and B5, respectively. The set of registers 1150*b* provide VrS2, VrS6, VrS10, VrS12 and VrS14 in B0, B1, B2, B3 and B4, respectively. The set of registers 1150*c* provide VrS4, VrS11 and VrS15 in B0, B1 and B2, respectively. The set of registers 1150*d* provide VrS8 in B0.

To provide a LP, LMP, UMP or UP read in P1, the set of registers of addr2 have a configuration as depicted in the set of registers 1151*a*, 1151*b*, 1151*c* and 1151*d*, respectively. The set of registers 1151*a* provide VrS1, VrS3, VrS5, VrS7, VrS9 and VrS13 in B0, B1, B2, B3, B4 and B5, respectively. The set of registers 1151*b* provide VrS2, VrS6, VrS10, VrS12 and VrS14 in B0, B1, B2, B3 and B4, respectively. The set of registers 1151*c* provide VrS4, VrS11 and VrS15 in B0, B1 and B2, respectively. The set of registers 1151*d* provide VrS8 in B0.

Any combination of page types can be read concurrently in different planes. For example, the page type for P0 can be any of LP, LMP, UMP, UP and SLC and the page type for P1 can be any of LP, LMP, UMP, UP and SLC.

FIG. 11G depicts a mapping between registers and data states, consistent with FIG. 11C1. A module 1169 includes sets of registers 1169*a* and 1169*b* associated with addresses addr1 and addr2, respectively. The set of registers 1169*a* includes register1 1170*a*, register2 1170*b*, register3 1170*c* and register4 1170*d*. The set of registers 1169*b* includes register1 1170*e*, register2 1170*f* and register3 1170*g*. A set of internal registers 1180 of the state machine is also depicted, including registers 1180*a*, 1180*b*, 1180*c*, 1180*d*, 1180*e*, 1180*f* and 1180*g* which store read voltages such as VrA, VrB, VrC, VrD, VrE, VrF and VrG, respectively. Further, the registers in the module 1169 are mapped to the registers in the state machine as indicated by the arrows. Specifically, register1 1170*a*, register2 1170*b*, register3 1170*c*, register4 1170*d*, register1 1170*e*, register2 1170*f* and register3 1170*g* are mapped to registers 1180*a*, 1180*e*, 1180*c*, 1180*g*, 1180*b*, 1180*d* and 1180*f*, respectively.

FIG. 11H depicts a mapping between registers and read operations, consistent with FIG. 11D1. The set of internal registers 1180 of the state machine, including registers 1180*a*, 1180*b* and 1180*c* store read voltages for first, second and third reads, respectively, in a read operation of a first plane P0. Registers 1180*e*, 1180*f* and 1180*g* store read voltages for first, second and third reads, respectively, in a read operation of a second plane P1. Register1 1170*a*, register2 1170*b* and register3 1170*c* are mapped to registers 1180*a*, 1180*b* and 1180*c*, respectively. Register1 1170*e*, register2 1170*f* and register3 1170*g* are mapped to registers 1180*e*, 1180*f* and 1180*g*, respectively. In this example, potentially one less internal register is used compared to FIG. 11G.

In the approach of FIG. 11G, the external controller stores values which indicate read voltages in the module 1169. As a result, if the external controller issues a multi-plane independent read command, both the planes have to use the same set of values and read voltages. To support a separate set of values for two planes, a duplicate set of registers could be added, e.g., in the pad area of the memory device. However, this is undesirable since the available area is limited. The techniques provided herein allow the controller to pass separate values for each plane without increasing the circuitry in the area-critical modules of the memory device. The registers can be re-mapped to the read voltage values for each plane when the read operation is preceded by a certain prefix command. One approach uses seven sets of 8-bit registers to store the values for each of the seven programmed states. However, for each page read, only two or three of the values are used, in the example of an eight-state memory device, with LP, MP and UP reads. One implementation uses three updates of a set of 8-bit registers to store the values for each plane. The first, second and third updates store the values for the first, second and third state reads, respectively. This approach allows the controller to perform multi-plane reads with different read voltages, thereby increasing parallelism. This improves random read performance by 33% at the system level, compared to a sequential read of the two planes. Moreover, the technique is compatible with cache read mode.

Another advantage is that the state machine does not have to know the page type which is being read. The state machine reads the registers for a specified address and causes the circuitry of the associated plane to apply the read voltages indicated by values in the registers to a selected word line in the plane, according to the order of the values in the registers, until no further read voltages are to be applied. This process is repeated for each page type which is read. The state machine does not have to know whether a LP, MP or UP read is being performed. As a result, the number of commands from the external controller which the state machine has to understand may be reduced. The external controller can provide a read command without specifying the page type.

In contrast, in the example of FIG. 11C1, the state machine reads in four values from a set of registers 1120 from one address, where the first and second values are for the LP read and the third and fourth values are for the UP read. The state machine then selects two of the values based on knowing the current page type being read.

FIG. 12A depicts waveforms of an example read operation in which a middle page is read from one plane and a lower or upper page is read from another plane. The horizontal axis depicts time in FIG. 12A-12E. A waveform 1200 depicts an external ready/busy status of the state machine. This is a status seen by the external controller. When this status is ready, the external controller may be able to output data. A high or low level of the waveforms 1200 and 1201 represents a ready or busy status, respectively.

A waveform 1201 depicts an internal ready/busy status of the state machine. This status is busy when the state machine is performing actions such as instructing the row control circuitry to supply voltages to word lines, instructing the column control circuitry to perform sensing, transferring read data from sense circuits to caches, and transferring read data between latches of sense circuits.

A waveform 1202 depicts voltage applied to a selected word line in a first plane (P0) in which the read type is a middle page read. The read voltages are VrB, VrD and VrF. 0 V may be applied at other times.

A waveform 1203 depicts voltages applied to a selected word line in a second plane (P1). In one option, shown by waveform 1203a, the read type is a lower page read and the read voltages are VrA and VrE. In another option, shown by waveform 1203b, the read type is an upper page read and the read voltages are VrC and VrG.

From t0-t1, commands may be issued by the external controller to begin a read operation. An example format of commands is: read type/address type/address/read type/address type/address/begin read. The read type can be, e.g., lower page, middle page, upper page, or single level cell (SLC) page. The address type can be three cycles which indicates the address includes three parts, e.g., plane, block and word line. In this example, assuming a lower page read is used for P1, the commands are: middle page/three cycle/P0, block0n, WL0n/lower page/three cycle/P1, block1n, WL1n/begin read. Block0n and WL0n represent an example block and selected word line, respectively, in a plane P0. Block1n and WL1n represent an example block and selected word line, respectively, in a plane P1.

From t0-t1, the external controller may also store values in the registers which indicate the read voltages. This is also referred to as loading the registers.

From t1-t2, the state machine reads the values in the registers and determines corresponding read voltages. The state machine instructs the row control circuitry to prepare to provide specified word line voltages and instructs the column control circuitry to prepare to perform sensing. From t2-t3, VrB is applied on WL0n while sensing occurs for associated memory cells of the word line, and VrA is applied on WL1n while sensing occurs for associated memory cells. This is a time period or clock period of type CP1 in which sensing occurs without transferring read results, e.g., within sense circuits or from sense circuits to caches.

From t3-t4, the read data obtained from sensing during t2-t3 is transferred into ADL for both WL0n and WL1n. See also FIG. 8B. VrD is also applied on WL0n and VrE is applied on WL1n in preparation for sensing using these read voltages.

From t4-t5, VrD continues to be applied on WL0n while sensing occurs for associated memory cells of the word line, and VrE continues to be applied on WL1n while sensing occurs for associated memory cells. t3-t5 is a clock period of type CP2 (first occurrence) in which sensing occurs and read results are transferred.

From t5-t6, the read data obtained from sensing from t4-t5 is transferred into ADL and from ADL into XDL as accumulated data for both WL0n and WL1n. VrF and VrE are applied on WL0n and WL1n, respectively.

From t6-t8, VrF continues to be applied on WL0n while sensing occurs for associated memory cells of the word line, and VrE continues to be applied on WL1n while sensing occurs for associated memory cells. However, the sensing on WL1n is a repeated sensing and the resulting read data is ignored by masking it out during a scan into ADL. That is, the read from the repeated read is not transferred from the sense circuits to the caches. t5-t8 is a clock period of type CP2 (second occurrence) in which sensing occurs and read results are transferred.

From t8-t9, the read data obtained from sensing from t7-t8 is transferred into ADL as accumulated data for WL0n.

At t6, the state machine knows that the read of WL1n in P1 is complete because sensing has occurred for the two read voltages of the lower page read type. The state machine therefore sets an external ready status by raising the waveform 1200. The external controller detects this change to the ready status and issues a check status command. In response, the state machine provides a status message, e.g., as a byte of status data, indicating that P1 is ready to stream out read data. In the byte, the bit positions and values can have pre-assigned meanings. For example, a first bit=0 may mean P0 is not ready to stream out data, and a second bit=1 may mean P1 is ready to stream out data.

Note that the external controller can issue a check status command at any time. For example, if such a command is issued before t6, the status message would indicate that no planes are ready to output data.

At t7, the external controller issues a command to output data from P1. An example format of such a command is: address type/stream out data. The address type can be five cycles which indicates the address includes five parts, e.g., plane, block, word line, column start and column end. Data from P1 is then output to the external controller from t7-t10.

In part of this time, from t7-t8, reading of WL0n continues and, from t8-t9, a data transfer operation occurs for WL0n.

At t10-t11, the external controller knows it has completed its read out of data from P1 and knows that data has not yet been read out from P0. The external controller also knows that read data from P0 has not been transferred from the sense circuits to the caches of P1 since this is not allowed by the state machine while data from P0 is being output. Based on this, the external controller issues a command to transfer data from the sense circuits to the caches of P0. In response to the command, the state machine sets the busy status from t11-t12 and performs the requested transfer. The state machine releases the caches of P0 and sets the ready status at t12. t8-t10a is a clock period of type CP3 in which sensing does not occur but read results are transferred. t10a-t11 may represent an idle period of the state machine.

The external controller detects this change to the ready status and issues a check status command. In response, the state machine provides a status message indicating that P0 is ready to stream out read data. At t13, the external controller issues a command to output data from P0. Data from P0 is then output to the external controller from t13-t14. At t14, the external controller knows it has completed its read out of data from P0 and that the read operation is completed for all planes.

In this example, the multiple planes comprise a first plane (P0, 101, see FIG. 1B) and a second plane (P1, 102); the row and column circuitry of the multiple planes comprises first row (101r) and column (101c) circuitry associated with the first plane and second row (102r) and column circuitry (102c) associated with the second plane; a read of the second plane is complete before a read of the first plane is complete; and the state machine is configured to allow the external controller to begin to read out data of the second plane from the second row and column circuitry while the read of the first plane continues.

Further, the first row and column circuitry, to perform a read of the first plane, is configured to apply a first number of read voltages (e.g., three) to a selected word line (WL0n) in the first plane; and the second row and column circuitry, to perform a read of the second plane, is configured to apply a second number of read voltages (e.g., two) to a selected word line in the second plane, wherein the first number is greater than the second number.

Also, the second row and column circuitry is configured to perform a repeated sensing of the second plane using a last read voltage (e.g., VrE for a lower page or VrG for an upper page) of the second number of read voltages; and the second row and column circuitry is configured to mask out sensing results from the repeated read.

Figure 12B:
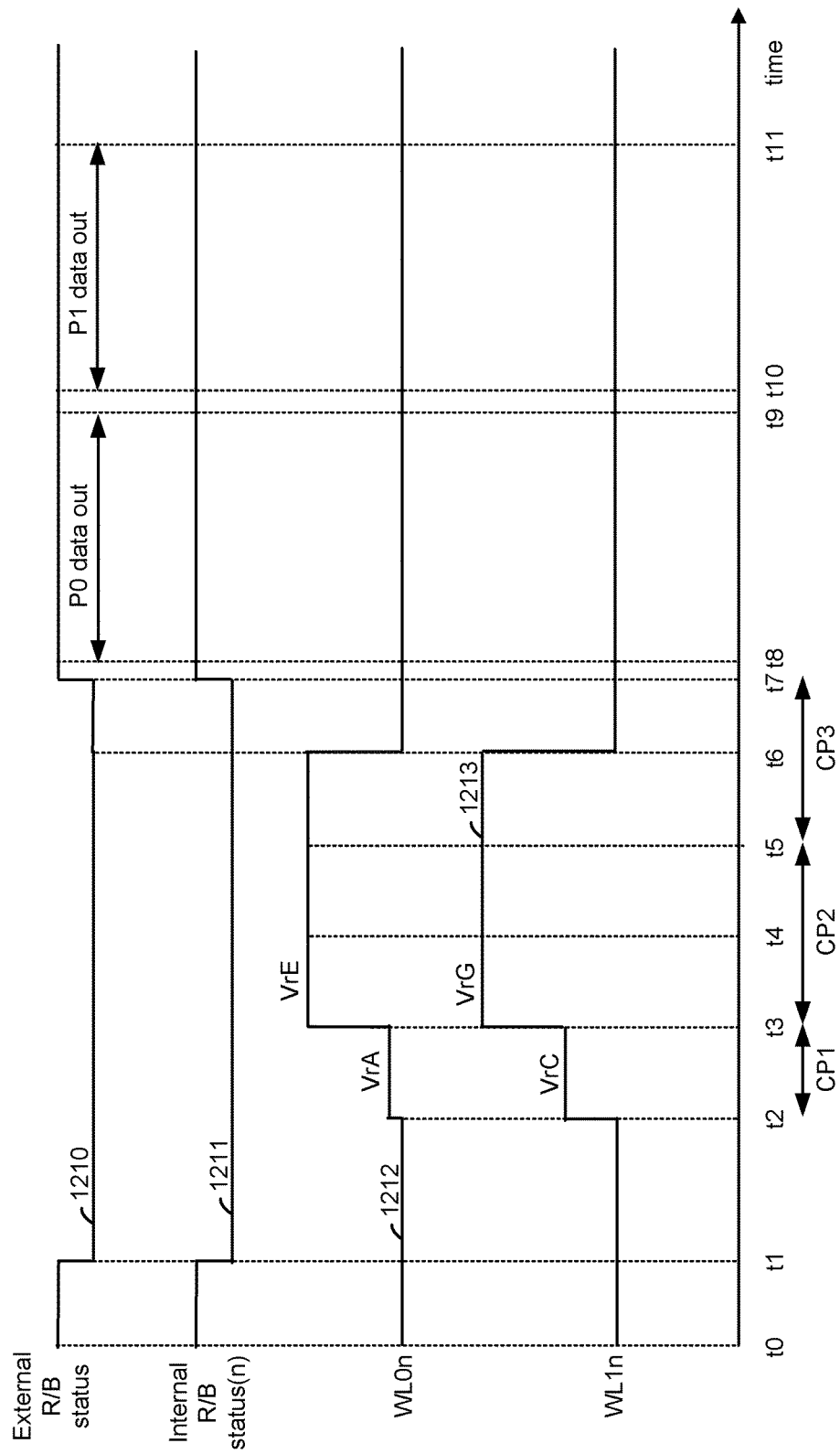
FIG. 12B depicts waveforms of an example read operation in which a lower page is read from one plane and an upper page is read from another plane.

FIG. 12B depicts waveforms of an example read operation in which a lower page is read from one plane and an upper page is read from another plane. This example differs from the example of FIG. 12B in that an equal number of read voltages are used in each plane, so that read data from each planes is available for output at the same time. In this case, the external controller can choose to output data from the different planes in an order which is based on relative priorities of the planes, highest priority first. Read data from P0 is output before read data from P1.

A waveform 1210 depicts an external ready/busy status of the state machine. A waveform 1211 depicts an internal ready/busy status of the state machine. A high or low level of the waveforms 1210 and 1211 represents a ready or busy status, respectively.

A waveform 1212 depicts voltage applied to a selected word line in a first plane (P0) in which the read type is a lower page read. The read voltages are VrA and VrE. 0 V may be applied at other times.

A waveform 1213 depicts voltage applied to a selected word line in a second plane (P1). The read type is a lower page read and the read voltages are VrA and VrE.

From t0-t1, commands may be issued by the external controller to begin a read operation. In this example, the commands are: lower page/three cycle/P0, block0n, WL0n/upper page/three cycle/P1, block1n, WL1n/begin read.

From t1-t2, the state machine instructs the row control circuitry to prepare to provide specified word line voltages and instructs the column control circuitry to prepare to perform sensing. From t2-t3, VrA is applied on WL0n while sensing occurs for associated memory cells of the word line, and VrC is applied on WL1n while sensing occurs for associated memory cells of the word line. This is a clock period of type CP1.

From t3-t4, the read data obtained from sensing from t2-t3 is transferred into ADL for both WL0n and WL1n. See also FIG. 8B. VrF is also applied on WL0n and VrG is applied on WL1n in preparation for sensing using these read voltages.

From t4-t5, VrE continues to be applied on WL0n while sensing occurs for associated memory cells, and VrG continues to be applied on WL1n while sensing occurs for associated memory cells. t3-t5 is a clock period of type CP2.

From t5-t6, the read data obtained from sensing from t4-t5 is transferred into ADL and then from ADL to XDL as accumulated data for both WL0n and WL1n. VrE and VrG continue to be applied on WL0n and WL1n, respectively.

At t7, the state machine knows that the read of WL1n in P1 is complete because sensing has occurred for the two read voltages of the lower page read type. The state machine therefore sets an external ready status by raising the waveform 1210. The external controller detects this change to the ready status and issues a check status command. In response, the state machine provides a status message indicating that both P0 and P1 are ready to stream out read data. For example, a first bit=1 may mean P0 is ready to stream out data, and a second bit=1 may mean P1 is ready to stream out data. t5-t7 is a clock period of type CP3. FIG. 12B has one clock period of type CP2 while FIG. 12A has two clock periods of type CP2.

At t8, the external controller issues a command to output data from P0 (or P1), for instance. Data from P0 is then output to the external controller from t8-t9.

At t9, the external controller knows it has completed its read out of data from P0 and that data is available to be read out from P1. At t10, the external controller issues a command to output data from P1. Data from P1 is then output to the external controller from t10-t11. At t11, the external controller knows it has completed its read out of data from P1 and that the read operation is completed for all planes.

In this example, a same number of read voltages (two) is applied to the selected word lines in both planes.

Figure 12C:
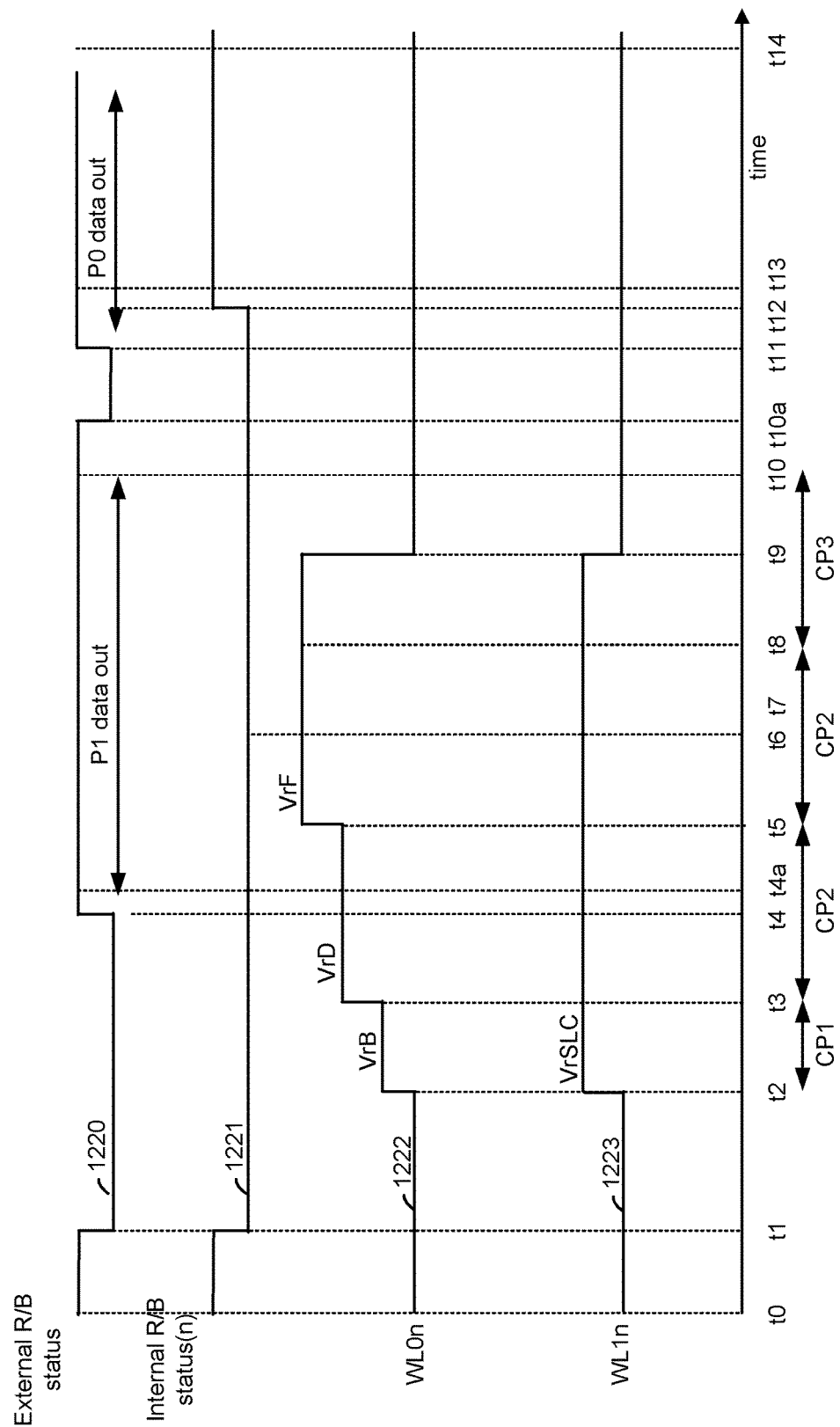
FIG. 12C depicts waveforms of an example read operation in which a middle page is read from one plane of three-bit cells and a page is read from another plane of one-bit cells.

FIG. 12C depicts waveforms of an example read operation in which a middle page is read from one plane of three-bit cells and a page is read from another plane of one-bit cells. This is an example of a hybrid SLC and multi-level read which reduces read latency for the SLC cells.

A waveform 1220 depicts an external ready/busy status of the state machine. A high or low level of the waveforms 1220 and 1221 represents a ready or busy status, respectively.

A waveform 1221 depicts an internal ready/busy status of the state machine.

A waveform 1222 depicts voltage applied to a selected word line in a first plane (P0) in which the read type is a middle page read. The read voltages are VrB, VrD and VrF. 0 V may be applied at other times.

A waveform 1223 depicts voltage applied to a selected word line in a second plane (P1). The read type is an SLC page read and the read voltage is VrSLC. This is an example of a hybrid SLC mode which allows reading of single-level memory cells and multi-level memory cells in respective planes in parallel. The latency of the SLC read operation can be reduced using the early cache release techniques described herein.

From t0-t1, commands may be issued by the external controller to begin a read operation. Example commands are: middle page/three cycle/P0, block0$n$, WL0$n$/SLC page/three cycle/P1, block1$n$, WL1$n$/begin read.

From t1-t2, the state machine instructs the row control circuitry to prepare to provide specified word line voltages and instructs the column control circuitry to prepare to perform sensing. From t2-t3, VrB is applied on WL0$n$ while sensing occurs for associated memory cells of the word line, and VrSLC is applied on WL1$n$ while sensing occurs for associated memory cells. This is a clock period of type CP1.

From t3-t4, the read data obtained from sensing from t2-t3 is transferred into XDL and ADL for both WL0$n$ and WL1$n$. VrD is also applied on WL0$n$.

From t4-t5, VrD continues to be applied on WL0$n$ while sensing occurs for associated memory cells of the word line, and VrSLC continues to be applied on WL1$n$ while sensing occurs for associated memory cells. The sensing results from this repeated read are masked out. t3-t5 is a clock period of type CP2.

From t5-t6, the read data obtained from sensing from t4-t5 is transferred into XDL and ADL as accumulated data for WL0$n$. VrF and VrSLC are applied on WL0$n$ and WL1$n$, respectively.

From t6-t8, VrF continues to be applied on WL0$n$ while sensing occurs for associated memory cells of the word line, and VrSLC continues to be applied on WL1$n$ while sensing occurs for associated memory cells. The sensing on WL1$n$ is a second repeated sensing and the resulting read data is masked out. t5-t8 is a clock period of type CP2. t8-t10 is a clock period of type CP3.

From t8-t9, the read data obtained from sensing from t7-t8 is transferred into ADL as accumulated data for WL0$n$.

At t4, the state machine knows that the read of WL1$n$ in P1 is complete because sensing has occurred for the one read voltage of the SLC page read type. The state machine therefore sets an external ready status by raising the waveform 1220. The external controller detects this change to the ready status and issues a check status command. In response, the state machine provides a status message indicating that P1 is ready to stream out read data.

At t4$a$, the external controller issues a command to output data from P1. Data from P1 is then output to the external controller from t4$a$-t10. In part of this time, reading and data transfer operations on WL0$n$ continue.

At t10-t10$a$, the external controller knows it has completed its read out of data from P1 and knows that data has not yet been read out from P0. The external controller also knows that read data from P0 has not been transferred from the sense circuits to the caches of P1. Based on this, the external controller issues a command to transfer data from the sense circuits to the caches of P0. In response to the command, the state machine sets the busy status from t10$a$-t11 and performs the requested transfer. The state machine then releases the caches of P0 and sets the ready status at t11. t10-t10$a$ may represent an idle period of the state machine.

The external controller detects this change to the ready status and issues a check status command. In response, the state machine provides a status message indicating that P0 is ready to stream out read data. At t13, the external controller issues a command to output data from P0. Data from P0 is then output to the external controller from t13-t14. At t14, the external controller knows it has completed its read out of data from P0 and that the read operation is completed for all planes.

In this example, the multiple planes comprise a first plane (P0, 101, see FIG. 1B) and a second plane (P1, 102). The type of read to be performed in each of the multiple planes comprises a first page type in the first plane and a second page type in the second plane, and the first page type comprises a middle page and the second page type comprises a single level cell (SLC) page.

Figure 12D:
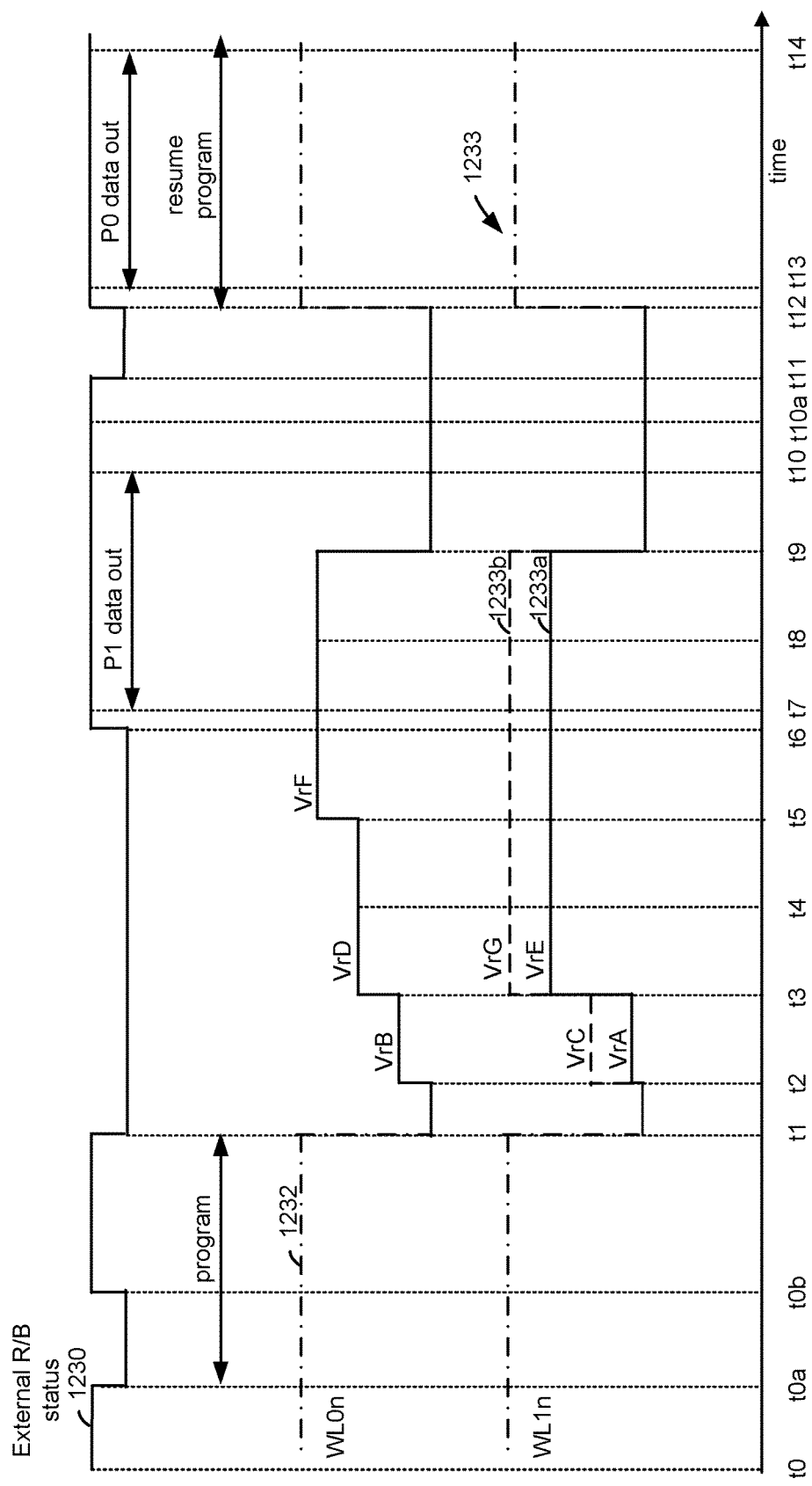
FIG. 12D depicts waveforms of the read operation of FIG. 12A with the addition of a program suspend and resume.

FIG. 12D depicts waveforms of the read operation of FIG. 12A with the addition of a program suspend and resume. In some situations, it is desirable to give a higher priority to a read request than to an in-process programming operation. In these situation, the program operation is suspended, the read operation occurs and the program operation is resumed. Alternatively, the read operations of FIGS. 12B and 12C can be provided with the addition of a program suspend and resume.

From t0-t0$a$, the external controller issues program commands. The commands may identify one or more planes, and a selected block and a selected word line in each selected block for which the associated memory cells are to be programmed.

From t0$a$-t1, programming occurs. The state machine has a busy status from t0$a$-t0$b$, as represented by the ready/busy waveform 1230, to perform actions such as receiving write data and instructing the row control circuitry and column control circuitry to supply voltages to the memory cells. After receiving the write data, the state machine sets the ready status at t0$b$. At t1, the external controller provides a command to pause the program operations and begin a read operation. The read commands as discussed in connection with FIG. 12A may be provided.

The state machine responds to the suspend command by storing state data which identifies the current state of the programming operation. For example, the state data may identify a plane, block and word line for one or more planes in which the programming is being performed. The state data may also identify a program pass number or mode, a program-verify iteration or loop number, and a program pulse level (Vpgm), for instance.

The internal ready/busy status of the state machine is similar to that shown in FIG. 12A.

A waveform 1232 depicts voltage applied to a selected word line in a first plane (P0) in which the read type is a middle page read.

A waveform 1233 depicts voltage applied to a selected word line in a second plane (P1). In one option, shown by waveform 1233$a$, the read type is a lower page read and the read voltages are VrA and VrE. In another option, shown by waveform 1233$b$, the read type is an upper page read and the read voltages are VrC and VrG. The level of the waveforms 1232 and 1233 is not necessarily to scale relative to other waveforms.

From t0$b$-t1, commands may be issued by the external controller to begin a read operation.

From t1-t2, the state machine instructs the row control circuitry to prepare to provide specified word line voltages and instructs the column control circuitry to prepare to perform sensing. From t2-t3, VrB is applied on WL0n while sensing occurs for associated memory cells of the word line, and VrA is applied on WL1n while sensing occurs for associated memory cells.

From t3-t4, the read data obtained from sensing during t2-t3 is transferred into ADL for both WL0n and WL1n. VrD is also applied on WL0n and VrE is applied on WL1n in preparation for sensing using these read voltages.

From t4-t5, VrD continues to be applied on WL0n while sensing occurs for associated memory cells of the word line, and VrE continues to be applied on WL1n while sensing occurs for associated memory cells.

From t5-t6, the read data obtained from sensing from t4-t5 is transferred into ADL and from ADL into XDL as accumulated data for both WL0n and WL1n. VrF and VrE are applied on WL0n and WL1n, respectively.

From t6-t8, VrF continues to be applied on WL0n while sensing occurs for associated memory cells of the word line, and VrE continues to be applied on WL1n while sensing occurs for associated memory cells. However, the sensing on WL1n is a repeated sensing and the resulting read data is ignored.

From t8-t9, the read data obtained from sensing from t7-t8 is transferred into ADL as accumulated data for WL0n.

At t6, the state machine knows that the read of WL1n in P1 is complete and therefore sets an external ready status by raising the waveform 1230. The external controller detects this change to the ready status and issues a check status command. In response, the state machine provides a status message indicating that P1 is ready to stream out read data.

At t7, the external controller issues a command to output data from P1. An example format of such a command is: address type/stream out data. The address type can be five cycles which indicates the address includes five parts, e.g., plane, block, word line, column start and column end. Data from P1 is then output to the external controller from t7-t10. In part of this time, from t7-t8, reading of WL0n continues and, from t8-t9, a data transfer operation occurs for WL0n.

At t10-t11, the external controller knows it has completed its read out of data from P1 and knows that data has not yet been read out from P0. The external controller also knows that read data from P0 has not been transferred from the sense circuits to the caches of P1 since this is not allowed by the state machine while data from P0 is being output. Based on this, the external controller issues a command to transfer data from the sense circuits to the caches of P0. In response to the command, the state machine sets the busy status from t11-t12 and performs the requested transfer. The state machine releases the caches of P0 and sets the ready status at t12. t10a-t11 may represent an idle period of the state machine.

The external controller detects this change to the ready status and issues a check status command. In response, the state machine provides a status message indicating that P0 is ready to stream out read data. At t13, the external controller issues a command to output data from P0. Data from P0 is then output to the external controller from t13-t14. At t14, the external controller knows it has completed its read out of data from P0 and that the read operation is completed for all planes.

Additionally, the external controller issues a resume programming command at t12 so that programming resumes from t12 onward. The state data is accessed to allow the programming to resume from the point at which it was suspended. Note that the external controller can perform the data read out separately from the state machine managing the programming process.

Note that providing the early cache release can result in an improved bit error rate.

Figure 12E:
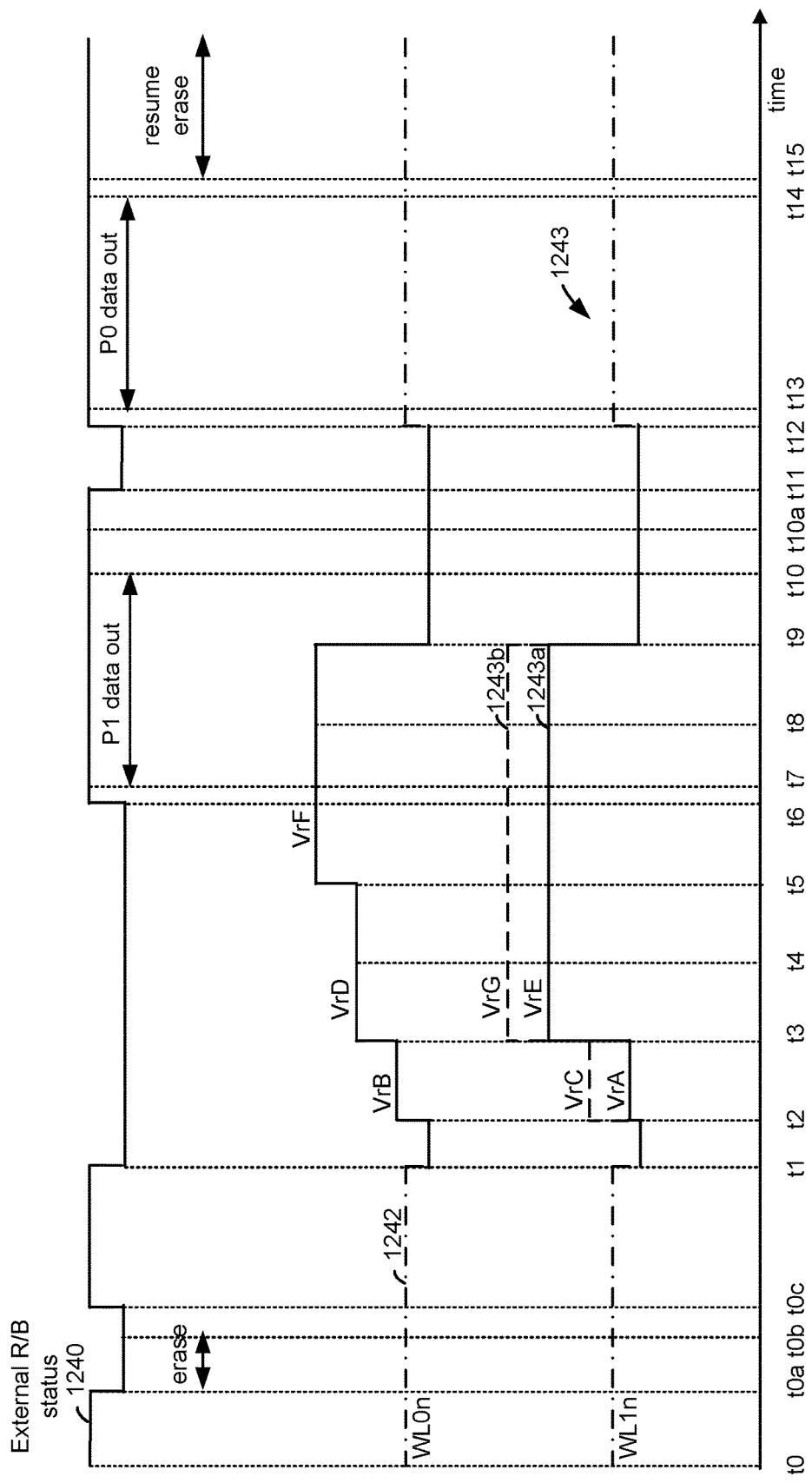
FIG. 12E depicts waveforms of the read operation of FIG. 12A with the addition of an erase suspend and resume.

FIG. 12E depicts waveforms of the read operation of FIG. 12A with the addition of an erase suspend and resume. In some situations, it is desirable to give a higher priority to a read request than to an in-process erase operation. In these situation, the erase operation is suspended, the read operation occurs and the erase operation is resumed. Alternatively, the read operations of FIGS. 12B and 12C can be provided with the addition of an erase suspend and resume.

From t0-t0a, the external controller issues erase commands. The commands may identify one or more planes, and a selected block in each selected block for which the associated memory cells are to be erased. In some cases, a portion of a block can be erased in which cases the associated word lines are identified.

From t0a-t0b, erasing occurs. The state machine has a busy status from t0a-t0b, as represented by the ready/busy waveform 1240, to perform actions such as instructing the row control circuitry and column control circuitry to supply voltages to the memory cells. Just before t0b, the external controller provides a command to pause the erase operations and begin a read operation. The erase operations are suspended at t0b and the caches are released. From t0c-t1, the read commands as discussed in connection with FIG. 12A may be provided.

The state machine responds to the suspend command by storing state data which identifies the current state of the erase operation. For example, the state data may identify a plane, block and word line for one or more planes in which the erasing is being performed. The state data may also identify an erase pass number or mode, an erase-verify iteration or loop number, and an erase pulse level, for instance.

The internal ready/busy status of the state machine is similar to that shown in FIG. 12A.

A waveform 1242 depicts voltage applied to a selected word line in a first plane (P0) in which the read type is a middle page read.

A waveform 1243 depicts voltage applied to a selected word line in a second plane (P1). In one option, shown by waveform 1243a, the read type is a lower page read and the read voltages are VrA and VrE. In another option, shown by waveform 1243b, the read type is an upper page read and the read voltages are VrC and VrG. The level of the waveforms 1242 and 1243 is not necessarily to scale relative to other waveforms.

From t0b-t1, commands may be issued by the external controller to begin a read operation.

From t1-t2, the state machine instructs the row control circuitry to prepare to provide specified word line voltages and instructs the column control circuitry to prepare to perform sensing. From t2-t3, VrB is applied on WL0n while sensing occurs for associated memory cells of the word line, and VrA is applied on WL1n while sensing occurs for associated memory cells.

From t3-t4, the read data obtained from sensing from t2-t3 is transferred into ADL for both WL0n and WL1n. VrD is also applied on WL0n and VrE is applied on WL1n in preparation for sensing using these read voltages.

From t4-t5, VrD continues to be applied on WL0n while sensing occurs for associated memory cells of the word line, and VrE continues to be applied on WL1n while sensing occurs for associated memory cells.

From t5-t6, the read data obtained from sensing from t4-t5 is transferred into ADL and from ADL into XDL as accumulated data for both WL0n and WL1n. VrF and VrE are applied on WL0n and WL1n, respectively. At t5, one plane (P1) is ready to output data and the cache is released.

From t6-t8, VrF continues to be applied on WL0n while sensing occurs for associated memory cells of the word line, and VrE continues to be applied on WL1n while sensing occurs for associated memory cells. However, the sensing on WL1n is a repeated sensing and the resulting read data is ignored.

From t8-t9, the read data obtained from sensing from t7-t8 is transferred into ADL as accumulated data for WL0n.

At t6, the state machine knows that the read of WL1n in P1 is complete and therefore sets an external ready status by raising the waveform 1240. The external controller detects this change to the ready status and issues a check status command. In response, the state machine provides a status message indicating that P1 is ready to stream out read data.

At t7, the external controller issues a command to output data from P1. An example format of such a command is: address type/stream out data. The address type can be five cycles which indicates the address includes five parts, e.g., plane, block, word line, column start and column end. Data from P1 is then output to the external controller from t7-t10. In part of this time, from t7-t8, reading of WL0n continues and, from t8-t9, a data transfer operation occurs for WL0n.

At t10-t11, the external controller knows it has completed its read out of data from P1 and knows that data has not yet been read out from P0. The external controller also knows that read data from P0 has not been transferred from the sense circuits to the caches of P1 since this is not allowed by the state machine while data from P0 is being output. Based on this, the external controller issues a command to transfer data from the sense circuits to the caches of P0. In response to the command, the state machine sets the busy status from t11-t12 and performs the requested transfer. The state machine releases the caches of P0 and sets the ready status at t12. The state machine may transfer the read data from SDL to XDL at t10a-t11.

The external controller detects this change to the ready status and issues a check status command. In response, the state machine provides a status message indicating that P0 is ready to stream out read data. At t13, the external controller issues a command to output data from P0. Data from P0 is then output to the external controller from t13-t14. At t14, the external controller knows it has completed its read out of data from P0 and that the read operation is completed for all planes.

Additionally, the external controller issues a resume programming command at t12 so that erasing resumes from t12 onward. The state data is accessed to allow the erasing to resume from the point at which it was suspended. Note that the external controller can perform the data read out separately from the state machine managing the erasing operation.

Accordingly, it can be seen that, in one embodiment, an apparatus comprises: multiple planes of memory cells; separate row circuitry coupled to each plane; separate column circuitry coupled to each plane; and a state machine coupled to an external controller, wherein: the state machine is configured to control the row circuitry and column circuitry of each of the multiple planes to concurrently read memory cells connected to a selected word line in each of the multiple planes using different read voltages in each of the multiple planes, and to provide status information for each of the multiple planes to the external controller indicating when read data is available for output to the external controller from each of the multiple planes.

In another embodiment, a method comprises: receiving read commands at a state machine on a memory die, the read commands identify a type of read to be performed in a first plane and a type of read to be performed in a second plane; receiving addresses, the addresses comprise a word line address for the first plane which is received at row and column circuitry of the first plane, and a word line address for the second plane which is received at row and column circuitry of the second plane; and using the state machine to control the row and column circuitry of the first plane and the row and column circuitry of the second plane during concurrent reading of memory cells connected to a first selected word line in the first plane and of memory cells connected to a second the selected word line in the second plane, wherein the state machine provides status information for each of the first and second planes to the external controller indicating when read data is available for output to the external controller from the first and second planes.

In another embodiment, an apparatus comprises a first plane comprising memory cells; a second plane comprising memory cells; first circuitry connected to the first plane; second circuitry connected to the second plane; and a controller. The controller is configured to: concurrently read data from the first plane by the first circuitry and read data from the second plane by the second circuitry; determine when the read of the first plane is complete; determine when the read of the second plane is complete; begin to read out data of the second plane from the second circuitry while the read of the first plane continues if the read of the second plane is complete before the read of the first plane is complete; begin to read out data of the first plane from the first circuitry while the read of the second plane continues if the read of the first plane is complete before the read of the second plane is complete; and read out data of the first plane from the first circuitry then read out data of the second plane from the second circuitry, if the read of the first plane is complete concurrently with the read of the second plane.

In another embodiment, an apparatus comprises means for performing each of the steps in the above-mentioned method. For example, an apparatus comprises: means for receiving read commands on a memory die, the read commands are received from an external controller, the external controller is external to the memory die, the read commands identify a type of read to be performed in a first plane and a type of read to be performed in a second plane; means for receiving addresses from the external controller, the addresses comprise page, block and word line addresses for the first plane which are received at row and column circuitry of the first plane, and page, block and word line addresses for the second plane which are received at row and column circuitry of the second plane; and means for controlling the row and column circuitry of the first plane and the row and column circuitry of the second plane during concurrent reading of memory cells connected to a selected word line in the first plane and of memory cells connected to a selected word line in the second plane, wherein the means for controlling provides status data for each of the first and second planes to the external controller indicating when read data is available for output to the external controller from the each of the first and second planes.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   multiple planes of memory cells, wherein the multiple planes comprise a first plane and a second plane;
   a first set of registers;
   a second set of registers;
   an external controller configured to provide a sequence of read commands for a selected word line of the first plane and a sequence of read commands for a selected word line of the second plane, to update values in the first set of registers with each read command for the selected word line of the first plane, and to update values in the second set of registers with each read command for the selected word line of the second plane; and
   a state machine coupled to the external controller, the state machine is configured to:
      in response to each of the read commands for the selected word line of the first plane, read the updated values from the first set of registers, and provide read voltages on the selected word line in the first plane according to an order of the updated values in the first set of registers, and
      in response to each of the read commands for the selected word line of the second plane, read the updated values from the second set of registers, and provide read voltages on the selected word line in the second plane according to an order of the updated values in the second set of registers.

2. The apparatus of claim 1, wherein:
   the state machine is configured to receive a status check command from the external controller, and in response to the status check command, provide a status message to the external controller indicating that a read of one of the multiple planes is complete; and
   in connection with the status message, the state machine is configured to receive from the external controller a command to stream out data, and row and column circuitry associated with the one of the planes is configured to receive from the external controller an address identifying a selected word line of the one of the multiple planes.

3. The apparatus of claim 1, wherein:
   the state machine comprises internal registers for the first plane and internal registers for the second plane; and
   the state machine is configured to read in the updated values from the first set of registers to the internal registers for the first plane in response to each of the read commands for the selected word line of the first plane, and read in the updated values from the second set of registers to the internal registers for the second plane in response to each of the read commands for the selected word line of the second plane.

4. The apparatus of claim 1, wherein:
   the updated values of each of the read commands for the selected word line of the first plane are for different page types;
   the read commands for the selected word line of the first plane do not specify the different page types; and
   the state machine is configured to read the updated values from the first set of registers and provide the read voltages on the selected word line in the second plane without knowing the different page types.

5. The apparatus of claim 1, wherein:
   the updated values in the first set of registers are customized to account for a characteristic of the memory cells in the first plane; and
   the updated values in the second set of registers are customized to account for a characteristic of the memory cells in the second plane.

6. The apparatus of claim 5, wherein:
   the characteristic of the memory cells in the first plane comprises a number of program-erase cycles; and
   the characteristic of the memory cells in the second plane comprises a number of program-erase cycles.

* * * * *